(12) United States Patent
Zheng et al.

(10) Patent No.: US 9,628,243 B2
(45) Date of Patent: Apr. 18, 2017

(54) COMMUNICATION METHOD WITH INDICATIONS IN THE PHY HEADER

(71) Applicant: Agency for Science, Technology and Research, Singapore (SG)

(72) Inventors: Shoukang Zheng, Singapore (SG); Haiguang Wang, Singapore (SG); Zhongding Lei, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 14/427,684

(22) PCT Filed: Sep. 12, 2013

(86) PCT No.: PCT/SG2013/000399
§ 371 (c)(1),
(2) Date: Mar. 12, 2015

(87) PCT Pub. No.: WO2014/042595
PCT Pub. Date: Mar. 20, 2014

(65) Prior Publication Data
US 2015/0249529 A1   Sep. 3, 2015

(30) Foreign Application Priority Data

Sep. 12, 2012  (SG) .................................. 201206797
Oct. 15, 2012  (SG) .................................. 201207676
Nov. 9, 2012   (SG) .................................. 201208310
Mar. 13, 2013  (SG) .................................. 201301863
Sep. 9, 2013   (SG) .................................. 201306776

(51) Int. Cl.
*H04L 5/00*   (2006.01)
*H04L 1/00*   (2006.01)
(Continued)

(52) U.S. Cl.
CPC .............. *H04L 5/0055* (2013.01); *H04L 1/00* (2013.01); *H04L 1/0061* (2013.01); *H04L 1/1607* (2013.01); *H04L 1/1685* (2013.01); *H04L 5/0044* (2013.01); *H03M 13/09* (2013.01); *H04L 43/10* (2013.01); *H04L 2001/0097* (2013.01)

(58) Field of Classification Search
CPC combination set(s) only.
See application file for complete search history.

(56) References Cited

U.S. PATENT DOCUMENTS

2007/0014237 A1*  1/2007  Nishibayashi ........ H04L 1/1614
                                                              370/229
2007/0054632 A1   3/2007  Lu et al.
(Continued)

*Primary Examiner* — Mounir Moutaouakil
(74) *Attorney, Agent, or Firm* — K. David Crockett, Esq.; Niky Economy Syrengelas, Esq.; Crockett & Crockett, PC

(57) ABSTRACT

According to various embodiments, a communication method may be provided. The communication method may include: at least one of sending a first data unit including a physical layer (PHY) header or receiving a first data unit including a PHY header. The PHY header may include at least a field to indicate whether a response data unit is intended to follow the first data unit, and to indicate the type of the response data unit, when a response data unit is intended to follow the first data unit. The type of the response data unit may be used to estimate the duration of the response data unit.

18 Claims, 11 Drawing Sheets

108

110

Send a first data unit comprising a physical layer (PHY) header And/ or receive a first data unit comprising a PHY header

(51) Int. Cl.
*H04L 1/16* (2006.01)
*H03M 13/09* (2006.01)
*H04L 12/26* (2006.01)

(56) References Cited

U.S. PATENT DOCUMENTS

| | | | |
|---|---|---|---|
| 2007/0171933 A1 | 7/2007 | Sammour et al. | |
| 2012/0327870 A1* | 12/2012 | Grandhi | H04W 28/06 370/329 |
| 2013/0223345 A1* | 8/2013 | Asterjadhi | H04L 69/04 370/328 |
| 2013/0272137 A1* | 10/2013 | Kwon | H04W 72/042 370/241 |
| 2013/0286959 A1* | 10/2013 | Lou | H04W 72/04 370/329 |
| 2015/0043407 A1* | 2/2015 | Wang | H04L 69/323 370/311 |

* cited by examiner

| B0 | B1 | B9 | B10 B11 | B12 | B13 | B14 | B17 | B18 | B23 |
|---|---|---|---|---|---|---|---|---|---|
| Aggregation | Length | | ACK Indication | NDP Indication | Doppler | CRC | | Tail | |

COMMUNICATION METHOD WITH INDICATIONS IN THE PHY HEADER

CROSS-REFERENCE TO RELATED APPLICATIONS

The present application claims the benefit of the Singapore Patent Application No. 201206797-1 filed on 12 Sep. 2012, the Singapore Patent Application No. 201207676-6 filed on 15 Oct. 2012, the Singapore Patent Application 201208310-1 filed on 9 Nov. 2012, the Singapore Patent Application 201301863-5 filed on 13 Mar. 2013, and the Singapore Patent Application 201306776-4 filed on 9 Sep. 2013, the entire contents of which are incorporated herein by reference for all purposes.

TECHNICAL FIELD

Embodiments relate generally to communication methods and communication devices.

BACKGROUND

In wireless communication, a mobile station (which may for example be referred to as a station or STA) may communicate with an access point (AP). In this communication, data may be lost, so there may be a need for an acknowledgement of received data.

SUMMARY

According to various embodiments, a communication method may be provided. The communication method may include: at least one of sending a first data unit including a physical layer (PHY) header or receiving a first data unit including a PHY header. The PHY header may include at least a field to indicate whether a response data unit is intended to follow the first data unit, and to indicate the type of the response data unit, when a response data unit is intended to follow the first data unit. The type of the response data unit may be used to estimate the duration of the response' data unit.

BRIEF. DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which:

FIG. 20 shows an illustration of a SIG-2 structure.

DESCRIPTION

Embodiments described below in context of the devices are analogously valid for the respective methods, and vice versa. Furthermore, it will be understood that the embodiments described below may be combined, for example, a part of one embodiment may be combined with a part of another embodiment.

In this context, the communication device as described in this description may include a memory which is for example used in the processing carried out in the communication device. A memory used in the embodiments may be a volatile memory, for example a DRAM (Dynamic Random Access Memory) or a non-volatile memory, for example a PROM (Programmable Read Only Memory), an EPROM (Erasable PROM), EEPROM (Electrically Erasable PROM), or a flash memory, e.g., a floating gate memory, a charge trapping memory, an MRAM (Magnetoresistive Random Access Memory) or a PCRAM (Phase Change Random Access Memory).

In an embodiment, a "circuit" may be understood as any kind of a logic implementing entity, which may be special purpose circuitry or a processor executing software stored in a memory, firmware, or any combination thereof. Thus, in an embodiment, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a "circuit" in accordance with an alternative embodiment.

Figure 1A:
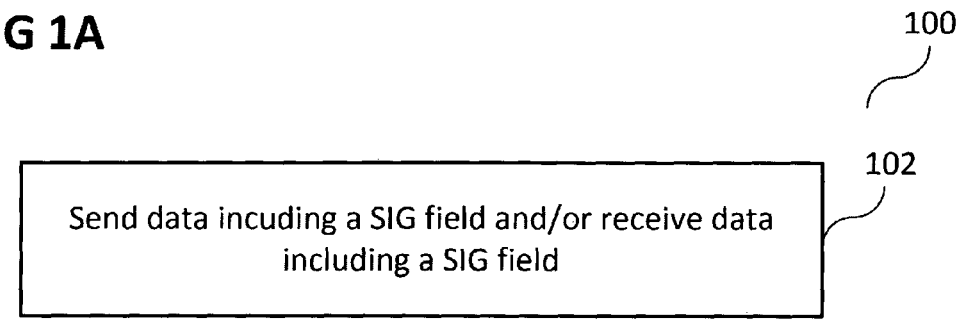
FIG. 1A shows a flow diagram illustrating a communication method in accordance with an embodiment.

FIG. 1A shows a flow diagram 100 illustrating a communication method according to various embodiments. In 102, data including a SIG field may be sent or data including a SIG field may be received. The SIG field may include at least one of an indication of an acknowledgement.

According to various embodiments, the SIG field may include an indication of a short acknowledgement for a null data packet type PS poll.

According to various embodiments, the SIG field may include an indication of at least one of a normal acknowledgement or a short acknowledgement.

According to various embodiments, the SIG field may include an indication of an acknowledgement for speed frame exchange.

According to various embodiments, the SIG field may include an indication of a duration for a network allocation vector.

According to various embodiments, the SIG field may include an indication of a type of a null data packet, wherein the indication may include an indication of 3 bits, if a channel bandwidth of 1 MHz is used for communication.

According to various embodiments, the SIG field may include an indication of a type of a null data packet, wherein the indication may include an indication of 4 bits, if a channel bandwidth of more than 2 MHz is used for communication.

According to various embodiments, the SIG field may include a relay bit indicating that ready to send indication is required to be relayed.

According to various embodiments, the SIG field may include an indication of whether frame forwarding time required by a relay is included in the ready to send duration.

According to various embodiments, the SIG field may include an indication of whether a null data packet frame or a normal frame is provided.

Figure 1B:
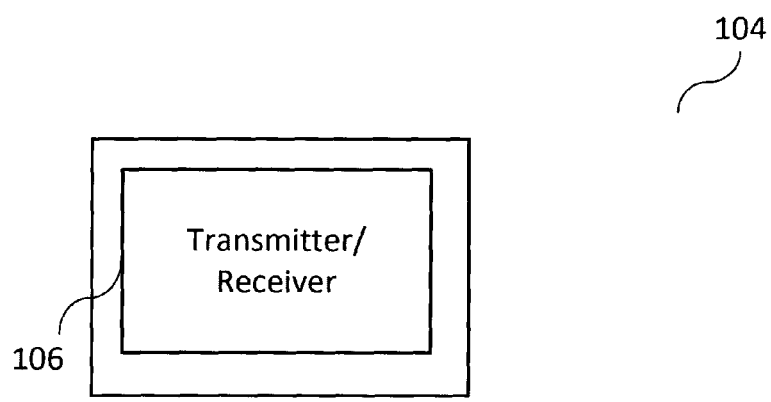
FIG. 1B shows a communication device in accordance with an embodiment.

FIG. 1B shows a communication device 104 according to various embodiments. The communication device 104 may include a transmitter 106 configured to send data including a SIG field and/or a receiver 106 configured to receive data including a SIG field. The SIG field may include at least one of an indication of an acknowledgement of at least 3 bits or an indication of a type of a null data packet.

According to various embodiments, the SIG field may include an indication of a short acknowledgement for a null data packet type PS poll.

According to various embodiments, the SIG field may include an indication of at least one of a normal acknowledgement or a short acknowledgement.

According to various embodiments, the SIG field may include an indication of an acknowledgement for speed frame exchange.

According to various embodiments, the SIG field may include an indication of an acknowledgement for TXOP sharing. TXOP sharing may be performed across the Relay (3 parties are involved: non-AP STA, Relay and AP). Relay may include two entities: Relay STA and Relay AP.

According to various embodiments, the SIG field may include an indication of a duration for a network allocation vector or an inactivity period, where inactivity period may refer to a duration time that there is no transmissions between the STAs or a sleep duration for the STA to reschedule its doze/awake cycle or a flow suspend duration for flow control. Short ACK may include a Duration Indication field and Duration field. It will be understood that Short ACK is equivalent to NDP ACK, According to various embodiments, the SIG field may include an indication of a type of a null data packet, wherein the indication may include an indication of 3 bits, if a channel bandwidth of 1 MHz is used for communication.

According to various embodiments, the SIG field may include an indication of a type of a null data packet, wherein the indication may include an indication of 4 bits, if a channel bandwidth of more than 2 MHz is used for communication.

Figure 1C:
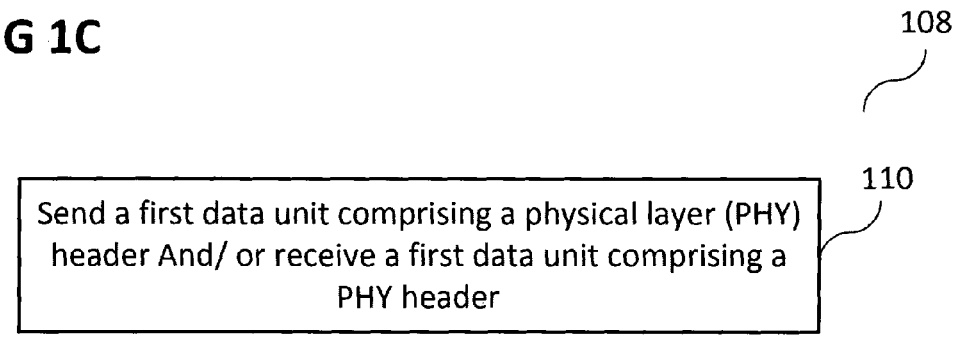
FIG. 1C shows a flow diagram illustrating a communication method in accordance with an embodiment.

FIG. 1C shows a flow diagram 108 illustrating a communication method according to various embodiments. In 108, a first data unit including a physical layer (PHY) header may be sent and/or a first data unit comprising a PHY header may be received. The PHY header may include one or more fields to indicate whether a response data unit is intended to follow the first data unit, and to indicate the type of the response data unit, when a response data unit is intended to follow the first data unit. The type of the response data unit can be used to estimate the duration of the response data unit.

According to various embodiments, an exceptional case may occur as follows: A null data packet of ACK is the response frame to a null data packet type of PS-Poll. Various embodiments may make use of NDP Type indication and other fields in SIG to infer that the following frame for NDP PS-Poll shall be NDP Modified ACK.

According to various embodiments, the first data unit may be a null data packet type PS-Poll and at least one of the fields in the PHY header indicates that the following response data unit is a null data packet type ACK and the null data packet type ACK is different from other null data packet type ACK (and for example used only for the null data packet type PS-Poll).

According to various embodiments, at least a field may indicate whether the response data unit is at least one of a normal response data type or a null data packet type.

According to various embodiments, the normal response data unit may be or may include at least one of normal ACK, normal Block ACK or a polling response frame According to various embodiments, the field may include at least 2 bits and only one value of the field is used to indicate all the short data response units including at least one of the following: a null data packet format of ACK, a null data packet format of short response frame to null data type PS-Poll, a null data packet format of CTS, and a null data packet format of Block Ack frame.

According to various embodiments, the indication may include at least three bits. According to various embodiments, a first value of the field may indicate that no response data unit is intended to follow the first data unit. According to various embodiments, a second value of the field may indicate the intended response data is a null data packet type. According to various embodiments, a third value of the field may indicate the intended response data having the size equal to or smaller than normal ACK. According to various embodiments, a fourth value of the field may indicate the intended response data having the size equal to or smaller than normal Block Acknowledgement but larger than normal ACK. According to various embodiments, a fifth value of the field indicates the intended response data unit having the size other than the four values listed above.

According to various embodiments, the field may include two bits (i.e. 4 values). According to various embodiments, a first value of the field may indicate that no response data unit is intended to follow the first data unit. According to various embodiments, a second value of the field may indicate the intended response data is a null data packet type. According to various embodiments, a third value of the field may indicate the intended response data having the size equal to or shorter than a pre-determined value but larger than the size indicated in the second value. According to various embodiments, a fourth value of the field may indicate the intended response data unit having the size larger than the size indicated by the third value.

According to various embodiments, the PHY header may include an indication of a response data unit for at least one of speed frame exchange or TXOP sharing.

According to various embodiments, the type of the response data unit may be a normal response data type for at least one of speed frame exchange or TXOP sharing.

According to various embodiments, the response data unit may be a normal ACK and its Duration field for NAV setting may protect the following transmission in one TXOP.

According to various embodiments, the type of the response data unit may be a null data packet type for at least one of speed frame exchange or TXOP sharing.

According to various embodiments, the response data unit may be a null data packet ACK or a null data packet format of short response frame to null data type PS-Poll and its Duration field for NAV setting may protect the following transmission in one TXOP.

According to various embodiments, the first data unit itself may be a null data packet type PS-Poll and the response data unit is a null data packet response frame to null data type PS-Poll.

According to various embodiments, the first data unit may be at least one of a null data packet type ACK or a null data packet type response frame responding to a null data type PS-Poll, and two or more bits in at least two fields of the first data unit may indicate that there is no response data unit intended to follow the first data unit.

According to various embodiments, the Duration Indication field set to 0 and the Duration field set to 0 may indicate that there is no response data unit intended to follow the first data unit.

According to various embodiments, the first data unit may be a null data packet type ACK or a null data packet type response frame responding to a null data type PS-Poll, and two or more bits in at least two fields of the first data unit may indicate that the response data unit is a type with the size larger than that of a normal data unit. A normal data unit is a data unit that is not a null data packet. A null data packet is a PPDU without Data field.

According to various embodiments, the Duration Indication field set to 1 and the Duration field set to 0 may indicate that the response data unit is a type with the size larger than that of a normal data unit.

According to various embodiments, the PHY header may include an indication of a duration for a network allocation vector.

According to various embodiments, the nonzero valid duration of first data unit may be set to protect at least the transmission of the response data unit, indicating the duration of at least one response data unit.

According to various embodiments, the intended receiver may defer at least one of its transmission or channel access for at least a duration based on the indication for the type of the response data unit.

According to various embodiments, the type of the response data unit may be a null data packet frame.

According to various embodiments, the type of the response data unit may be a normal frame with the size equal to or short than that of a normal ACK.

According to various embodiments, the type of the response data unit may be a normal frame with the size equal to or smaller than that of a normal Block ACK but larger than that of a normal ACK.

In the following, short frames, for example for IEEE 802.11-based Networks, will be described. Examples of short frame are Short Ack (acknowledgement), Short CTS (clear to send), Short Block Ack, NDP (null data packet) type PS-Poll (power save poll), NDP probe request, NDP sounding, short beamforming report Poll frame and Short MAC (medium access control) header.

Active STAs (stations) with TIM (traffic indication map) bit on may be allowed to poll the AP after receiving the beacon with TIM. A low power/Non-TIM STA may be allowed to transmit PS-Poll to its associated AP (access point) after wakeup without listening to the beacon. Due to the fact that PS-Poll may be widely used for power saving and low power operation, short frame format of ACK and PS-Poll may improve transmission efficiency and reduces power consumption.

In the following, NDP Type Indication will be described.

According to various embodiments, methods to indicate the types of NDP frame in SIG may be provided. More than 8 NDP frames may be provided. Furthermore, a method to indicate the type of NDP frames may be provided.

SIG may mean SIGNAL field of PPDU (physical protocol data unit).

S1G PPDU (i.e. the PPDU format for IEEE 802.11ah) may include:

STF Short Training field;
LTF Long Training field;
SIG SIGNAL field;
SIG-A Signal A field;
D-STF Short Training field for data;
D-LTF Long Training field for data;
SIG-B Signal B field; and
Data.

The Data field may carry the PSDU(s) (Physical layer Service Data Unit).

The null data packet (NDP) may include:
STF Short Training field;
LTF Long Training field; and
SIG SIGNAL field.

The null data packet (NDP) frame has no Data field.

One of PPDU formats that includes PSDU could be:
STF Short Training field;
LTF Long Training field; and
SIG SIGNAL field; and
Data.

The Data field may carry the PSDU(s).

For example, for 8 types of NDP frames, a 3-bit NDP-T (NDP Type) field within the SIG bits may be provided. When the AP/STA receives a NDP frame the AP/STA may proceed to obtain the NDP-T field to know the type of NDP frame. If there are more than 8 types (for example assuming less than 16 (in other words: <16)) of NDP frames, a 4-bit NDP-T field within SIG bits may be provided. However, some NDP type frames may have used up all the bits in the SIG and may not support 4-bit NDP-T field, e.g. NDP type PS-Poll uses up all the bits as shown in the following example (for example like illustrated in Table 1).

TABLE 1

Example of NDP Type PS-Poll SIG Design

| Field | Bit width | Comments |
|---|---|---|
| NDP Type Indication | 4 | |
| TA (transmitter address) | 9 | (partial) AID (association identifier) |

TABLE 1-continued

Example of NDP Type PS-Poll SIG Design

| Field | Bit width | Comments |
|---|---|---|
| RA (receiver address) | 9 | (partial) BSSID (Basic Service Set Identification) |
| Preferred MCS (Modulation and Coding Scheme) | 4 | |
| Tail bits | 6 | TBD (to be determined, for example depending on group's decision on tail bit support) |
| CRC (cyclic redundancy check) | 4 | |
| TOTAL | 36 | 2 MHz case, there are 12 reserved bits |

According to various embodiments, the following options for NDP-T indication may be provided:

In Option 1, a re-design of the fields in NDP type frames may be provided so that 4-bit NDP-T field may be supported in all NDP type frames.

In Option 2, 3-bit NDP-T plus one extended reserved bit that can be accommodated in some NDP types may be used to differentiate more than 8 types of NDP frame, like will be described in more detail below.

In Option 3, some NDP types may not be supported for 1 MHz case, and may be defined 3-bit NDP-T for channel bandwidth equal to 1 MHz and 4-bit NDP-T for channel bandwidth greater or equal to 2 MHz, like will be described in more detail below.

According to various embodiments, for Option 2, 3-bit NDP-T and one extended bit may be used to indicate NDP types. For example, assuming short ACK/CTS has at least one reserved bit and one 3-bit value (e.g. 0b111) may be reserved to identify both short ACK and CTS. By extending one reserved bit (with the same position) in both short ACK and CTS as the extended type identification, it may be possible to determine whether it is a short ACK or short CTS.

According to various embodiments, the protocol to handle NDP-T Field in Option 2 may be as follows: If the AP/STA receives the NDP frames after identifying this NDP frame, the AP/STA may proceed to identify the NDP-T fields so that it can know which NDP type the received frame is. When AP/STA identifies that the NDP-T field value is the defined case for extended indication, it may check the reserved bit (used as extended type identification bit) to further determine which NDP type the frame is.

According to various embodiments, for Option 3, 3-bit NDP-T may be used for 1 MHz channel bandwidth and 4-bit NDP-T may be used for 2 MHz channel bandwidth.

In the 1 MHz case, e.g. NDP sounding may not be applicable. Then 3-bit NDP-T may not be required to cover NDP sounding case, which may mean the NDP-T field value for NDP sounding is not in the range of [0,7]. Assuming that there are 6 NDP types for 1 MHz case, the value 0-5 (0b000-0b101) may be used for 3-bit NDP-T.

In the 2 MHz case, NDP sounding and other NDP type frames that are not supported in 1 MHz may be differentiated with a 4-bit NDP-T value (e.g. large than 7). For example, if there are 2 NDP types (short beamforming report Poll frame and NDP sounding) only defined for 2 MHz case. The value 0-5 (0b000-0b101) may be used for 4-bit NDP-T to indicate 6 NDP types that is supported in 1 MHz case, and the value of (0b1000-0b1001) for 4-bit NDP-T to indicate 2 NDP types that are defined only for 2 MHz case.

According to various embodiments, the protocol to handle NDP-T Field in Option 3 may be as follows: If the AP/STA receives the NDP frames after identifying that it is a NDP frame, the AP/STA may determine that it is for 1 MHz or >=2 MHz channel and proceed to identify the NDP-T fields so that it can know which NDP type the received frame is. For 1 MHz channel, it may only be needed to check 3-bit NDP-T field. For channel bandwidth >=2 MHz, it may be needed to check 4-bit NDP-T field.

In the following, Short Ack for NDP Type PS-Poll according to various embodiments will be described. According to various embodiments, a design of short Ack for NDP type PS-Poll frame may be provided. Short Ack and NDP type PS-Poll may have been accepted into IEEE specification framework (IEEE 802.11-1137-10-00ah-specification-framework-for-tgah, Mingyong Park, "IEEE 802.11ah Specification Framework"). In Section R.4.4.2.1.A thereof, it is specified that the draft specification shall support the following short ACK format with SIG fields that are the same as those in normal SIG: CRC (4 bits) and Tail (6 bits-TBD), and the short ACK SIG shall include an ACK ID field (bits TBD) which use partial FCS and the information from the scrambling seed in the SERVICE field of the frame being acknowledged for the computation of the ACK ID for short ACK frames.

However, upon receiving NDP type PS-Poll frame from the STA, the AP may send a response frame to STA as follows:

(1) Normal DATA/ACK, which requires no change for the protocol;

(2) Short ACK, which requires some modification since there is a very short checksum of the received frame (CRC 4 bits for SIG) and no scrambling seed can be used to compute ACK ID field;

(3) Short Response Frame, which requires that a new rule/protocol shall be defined.

Hence, according to various embodiments, the following options may be provided:

In Option 1, the AP may respond to NDP type PS-Poll with normal ACK.

In Option 2, the AP may respond to NDP type PS-Poll with short ACK but with modification. ACK ID may be computed differently. It will be described in more detail below how to compute ACK ID according to various embodiments.

In Option 3, the AP may respond to NDP type PS-Poll with a new Short Response Frame.

More details on option 2 will be given in the following, where short Ack with modification will be described.

In the following, Short Ack SIG Design according to various embodiments will be described.

For example, an event that there are two concurrent transmissions of NDP type PS-Poll: A→AP (which for example may mean a transmission from STA A to AP) and B→AP (which for example may mean a transmission from STA B to AP) will be described. Both A and B may expect short Ack from AP. Suppose that AP can only receive a strong signal from A and respond to A's NDP PS-Poll with short Ack that can reach B. B receives AP's short Ack, which should carry identification of STA e.g. partial AID information in short response frame SIG so that the possibility of this false short Ack case should be zero. The example of such false short Ack occurs at one AP is shown in FIG. 2.

Figure 2:
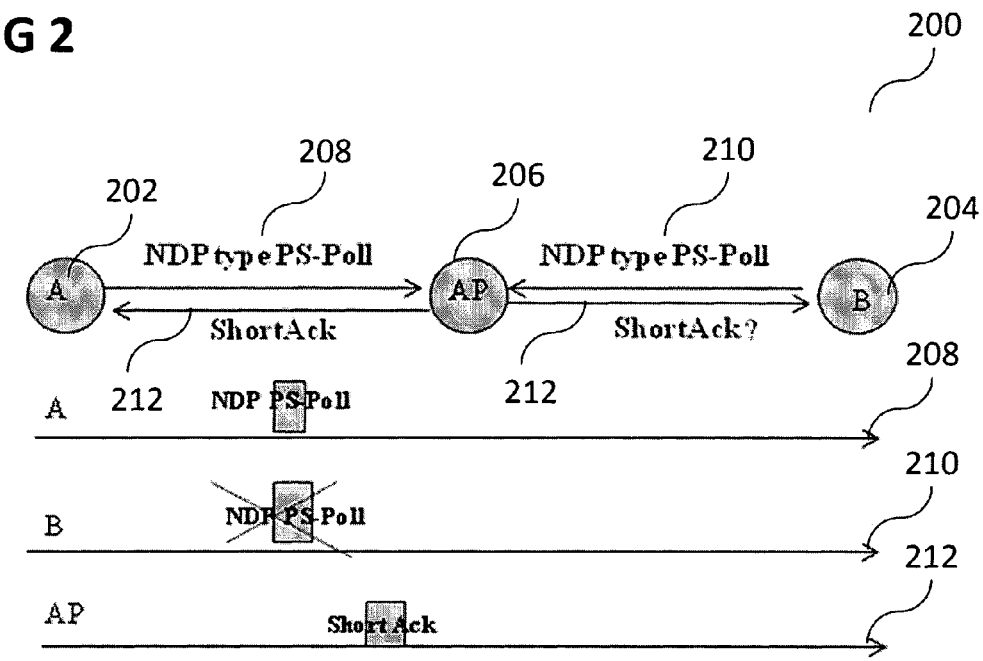
FIG. 2 shows an illustration of a false Short Ack for NDP PS-Poll.

FIG. 2 shows an illustration 200 of a false Short Ack for NDP PS-Poll with one AP 206 and a first station 202 (STA A) and a second station 204 (STA B). FIG. 2 illustrates two concurrent transmissions of NDP type PS-Poll: A→AP1 208

(from the first station 202 to a first AP (which may also be referred to as AP1), for example the AP 206) and B→AP2 210 (from the second station 204 to a second AP which may also be referred to as AP2 and which is not shown in FIG. 2). A 202 may expect a short Ack from AP1 and B expects a short Ack from AP2. Suppose that AP1 206 responds to A's 202 NDP PS-Poll with short Ack that can reach B 204, but AP2 can't receive B's 204 NDP PS-Poll. B 204 receives AP1's 206 short Ack. If B 204 has a shorter transmission range when it sends NDP PS-Poll that may reach AP1 206, and AP1 206 may have a longer transmission range when it sends NDP short Ack 212 that can reach B 204, a false short Ack may occur if scrambled PBSSID (partial BSSID) and PAID (partial AID) bits in NDP PS-Poll frame are the same for A 202 and B 204. The possibility of this false short Ack case could be very low because it carries both AP and STA's identification and duplicate probability of same NDP PS-Poll's TA (e.g. scrambled PBSSID) bits may be low due to that B's transmission will likely corrupt A's transmission at AP1, or B's transmission range is long, or B may be able to detect if it can hear AP1's beacon frame. The example of such false short Ack occurs at two APs is shown in FIG. 3.

Figure 3:
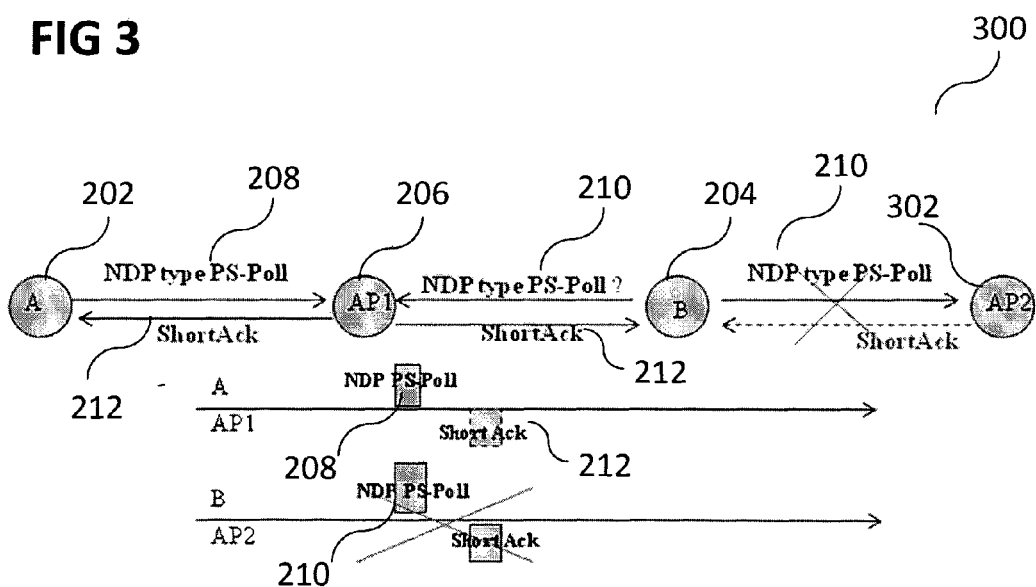
FIG. 3 shows an illustration of a false Short Ack for NDP PS-Poll with two APs.

FIG. 3 shows an illustration 300 of a false Short Ack for NDP PS-Poll with two APs, for example the first access point AP1 206 and the second access point AP2 302. Various devices and signals shown in FIG. 3 are similar or identical to devices and signals shown in FIG. 2, for which the same reference signs may be used and duplicate description may be omitted.

The above examples show that including transmitter and receiver address/identification (for example to an ACK ID (identifier)) according to various embodiments may be helpful to avoid the false short Ack.

Following the same structure of short Ack for non-NDP type frames in Table 2, short Ack for NDP type PS-Poll may have the field ACK ID as the identifier for pairing frame exchange i.e. short Ack for NDP type PS-Poll frame.

TABLE 2

Example of NDP Type Short Ack SIG Design

| Field | Bit width | Comments |
|---|---|---|
| Message type indicator | 4 | Unused MCS field in normal data packet |
| ACK ID | >=14? 12 | Based on Partial FCS and Scramble Seed of received frame |
| DURATION | 6-8 | May be required or may not be required |
| More Data | 1 | |
| TBD | TBD | |
| Tail bits | 6 | TBD (Depending on group's decision on tail bit support) |
| CRC | 4 | |
| TOTAL | 36 | 2 MHz case, there are 12 reserved bits |

However, the design of ACK ID may be different (for example different from the example as shown in Table 2), as will be described in more detail in the following.

When the AP uses short Ack as the response frame for the received NDP type PS-Poll, the following information (wherein some information may be included in NDP type PS-Poll) may be used to compute the identifier for the pairing frame exchange i.e. short Ack for NDP type PS-Poll:

information of STA, e.g. MAC address, AID;
SIG bits of received NDP type PS-Poll frame to be acknowledged;
information of AP, e.g. MAC address, timestamp, SQN or (partial) FCS of the beacon, partial SSID; and
hash function of the above information.

According to various embodiments, four options for the short Ack SIG format may be provided, like will be described with reference to Table 3 to Table 6.

TABLE 3

Option 1: Short Ack SIG for NDP Type PS-Poll

| Field | Bit width | Comments |
|---|---|---|
| Message type indicator | 4 | Unused MCS field in normal data packet |
| TA | 9 | (partial) AID |
| RA | 9 | (partial) BSSID |
| Preferred MCS | 4 | |
| Tail bits | 6 | TBD (Depending on group's decision on tail bit support) |
| CRC | 4 | |
| TOTAL | 36 | 2 MHz case, there are 12 reserved bits |

According to various embodiments, in Option 1 (compare Table 3 for SIG fields), the fields of RA (receiver address) and TA (transmitter address) may be defined, RA and TA bits may be used as the identifier for pairing frame exchange i.e. short Ack for NDP type PS-Poll.

The probability of exact same RA and TA of short Ack for NDP type PS-Poll may be low due to the design of RA, which may be based on (partial) AID of the STA that sends NDP type PS-Poll and/or CRC bits of NDP type PS-Poll to identify the receiver of Short Ack, and the design of TA, which may be based on partial FCS and Scramble Seed of received beacon frame or RA bits (and possibly CRC bits) of NDP type PS-Poll to identify the transmitter of Short Ack.

TABLE 4

Option 2: Short Ack SIG for NDP Type PS-Poll

| Field | Bit width | Comments |
|---|---|---|
| Identification | 4 | Type ID for Short Ack for NDP type PS-Poll. |
| ACK ID | TBD | Based on Partial FCS and Scramble Seed of received beacon frame, or RA bits (e.g. PBSSID) and/or CRC bits of NDP type PS-Poll, as well as TA bits (e.g. PAID) of NDP type PS-Poll. Suggest to use all unused bits |
| More Data | 1 | |
| Tail bits | 6 | TBD (Depending on group's decision on tail bit support) |
| CRC | 4 | |
| TOTAL | 36 | 2 MHz case, there are 12 reserved bits |

According to various embodiments, in Option 2 (compare Table 4 for SIG fields), ACK ID may be defined and used as the identifier for pairing frame exchange i.e. short Ack for NDP type PS-Poll. One combined field i.e. ACK ID in SIG to replace RA and TA fields may be designed, but may have different length. It is to be noted that while computation of ACK ID in short Ack for the received frame other than NDP type is based on partial FCS (frame check sequence) and scrambling seed of received frame, computation of ACK ID in short Ack for NDP PS-Poll may be based on the methods shown in the following for ACK ID computation.

The design according to various embodiments may ensure a low duplication probability of RA and TA bits or ACK ID for NDP type and ACK ID for non-NDP type frame, due to the difference between the two computation methods. The identification in SIG bits may be used to differentiate two types of short Ack.

TABLE 5

Option 3: Short Ack for NDP Type PS-Poll

| Field | Bit width | Comments |
| --- | --- | --- |
| Identification | 4 | Type ID for Short Ack for NDP type PS-Poll. |
| ACK ID | 12-14 (Same as defined in Short Ack for non-NDP frame) | Based on Partial FCS and Scramble Seed of received beacon frame, or RA bits (e.g. PBSSID) and/or CRC bits of NDP type PS-Poll, as well as TA bits (e.g. PAID) of NDP type PS-Poll. Suggest to use all unused bits |
| Duration/ACK ID Ext. | 6-8 | # of bits is same as defined in Short Ack for non-NDP frame |
| More Data | 1 | |
| Tail bits | 6 | TBD (Depending on group's decision on tail bit support) |
| CRC | 4 | |
| TOTAL | 36 | 2 MHz case, there are 12 reserved bits |

According to various embodiments, in Option 3, the same structure as the short Ack for non-NDP type may be used but may have a re-defined DURATION field (if it is defined) or use some reserved bits in current short Ack design (if DURATION field is not defined). The newly defined/redefined field may be ACK ID Ext.

ACK ID and ACK ID Ext fields may be used as the identifier for the pairing frame exchange, where ACK ID may be the resulting bits based on partial FCS and scramble seed of received beacon frame or RA bits of NDP frame being acknowledged, and some TA bits of NDP frame being acknowledged. E.g. 9 RA bits and 3 MSB (most significant bits) of TA field for 12 ACK ID bits, and ACK ID Ext is some (remaining) TA bits of NDP frame being acknowledged. E.g. 6 LSB (least significant bits) of TA field for 6 DURATION/ACK ID Ext bits. If more bits can be used for ACK ID Ext, CRC bits of the received NDP type frame can be used that is being acknowledged. According to various embodiments, other bit arrangement may be provided, dependent on whether to place the above bits into the fields of ACK ID/ACK ID Ext.

According to various embodiments, ACK ID may be used to refer to the combination of ACK ID and ACK ID Ext bits/fields without causing any ambiguity.

TABLE 6

Option 4: Short Ack for NDP Type PS-Poll

| Field | Bit width | Comments |
| --- | --- | --- |
| Identification | 4 | Type ID for Short Ack for NDP type PS-Poll. |
| ACK ID | 12-14 | Based on Partial FCS and Scramble Seed of received beacon frame, or RA bits (e.g. PBSSID) and/or CRC bits of NDP type PS-Poll, as well as TA bits (e.g. PAID) of NDP type PS-Poll. |
| Duration | 6-8 | |
| More Data | 1 | |
| Tail bits | 6 | TBD (Depending on group's decision on tail bit support) |
| CRC | 4 | |
| TOTAL | 36 | 2 MHz case, there are 12 reserved bits |

According to various embodiments, Option 4 may follow the same field structure as the short Ack for non-NDP type. ACK ID may be the identifier for the paring frame exchange, 12-14 bits. ACK ID may be a function of RA and TA bits of NDP type frame. ACK ID may be a function of RA bits of NDP type frame and resulting bits based on partial FCS and scramble seed of received beacon frame. CRC bits of NDP frame may be used as the input for the function to compute ACK ID as well if there is enough bit space.

In the following, ACK ID Computation according to various embodiments will be described.

According to various embodiments, ACK ID may be computed for short Ack as the response to NDP type PS-Poll, for example using STA's information:
MAC address, which only partial MAC address is feasible;
AID,
  Which may be used as receiver address for short Ack
  From which full/partial AID/other equivalent AID-based value can be used to identify AID of the STA
  Of which (partial) AID exists in SIG bits
  Which may be combined with the information of AP that is used as transmitter address for short Ack, as the identifier for pairing frame exchange i.e. short Ack for NDP type PS-Poll frame According to various embodiments, ACK ID may be computed for short Ack as the response to NDP type PS-Poll, using SIG bits of NDP type PS-Poll, based the example in Table 1:
MCS, which may not be helpful.
RA, e.g. (Scrambled) Partial BSSID, which may be common to all STAs associated with the same AP and can be used to identify different BSSID (APs) with low error probability. It is to be noted that (partial) BSSID can be used as transmitter address for Short Ack. RA field of NDP PS-Poll may be computed by the STA, based on partial FCS and scrambling seed of received beacon from AP.
TA, e.g. (Partial) AID, which is dependent on the number of ACK ID bits in SIG and can be used as receiver address for Short Ack.
CRC bits (4 bits), which may be not sufficient to differentiate the PS-Polls from multiple STAs to avoid the duplicate ACK ID problem, and may be used together with RA bits e.g. Partial BSSID (9 bits in the example in Table 1) to construct an ACK ID with 13 bits.
Tail bits, which may also not be helpful.
Preferred MCS, which may also not be helpful.

ACK ID may be computed for short Ack as the response to NDP type PS-Poll, using the beacon information:
  Scramble seed of Service field; and
  Partial FCS.

If the RA field of NDP type PS-Poll is based on the above beacon information, due to limited bit space (e.g. 9 bits) for RA field in SIG, RA bits may be expanded into more bits using the beacon info or combined with CRC bits in SIG of the received frame to form an ACK ID. For example, if the number of ACK ID bits is larger than the number of CRC bits and RA bits of NDP type PS-Poll that are used to construct ACK ID field, ACK ID based on CRC bits may be obtained and expanded RA bits (e.g. (scrambled) partial BSSID or the computation results that is based on partial FCS and scrambling seed of the received beacon frame).

When partial BSSID is used for RA field of NDP type PS-Poll frame, expanded RA bits may be computed using some more extra bits of BSSID other than partial BSSID used in NDP PS-Poll. For example, if partial BSSID uses 9 bits, then expanded RA bits (assuming 12 bits) may be obtained by adding three more BSSID bit into partial BSSID. The method may be applicable to scrambled PBSSID as well, as long as scrambling bits are also expanded and known to both AP and STA.

The method may also be applied to the computation results that are based on partial FCS and scrambling seed of the received beacon frame.

For the ACK ID computation for Option 2 according to various embodiments, the field structure may be shown as in Table 4. If RA field of NDP type PS-Poll is not based on partial FCS and Scrambling Seed of the received beacon frame, which are used for ACK ID computation, AP and STA may have to store the info of partial FCS and Scrambling Seed of the beacon frame or the resulting bits (ACK ID) based on the information. The complexity or the cost of this scheme may be higher than Option 1.

The AP may use some or all the following bits in SIG of NDP type PS-Poll (SIG field structure is assumed as in Table 1) to compute ACK ID in short Ack as the response to the received NDP type PS-Poll sent by STA:
  RA bits (and possibly CRC bits) of NDP type PS-Poll or Partial FCS and scrambling seed of the received beacon frame; and
  STA's (partial) AID or CRC bits of the received NDP type PS-Poll.

For example, ACK ID may include or may consist of some of RA bits and all TA bits of NDP type frame. For example, 14 bits for ACK ID may be considered. For example, the NDP PS-Poll frame structure as in Table 1 with RA=9-bit PBSSID and TA=9-bit PAID may be assumed:
  ACK ID use 8 of 9 PBSSID bits. E.g. 8 LSB PBSSID bits;
  Divide 9-bit PAID into two parts: PAID-MSB and PAID-LSB. E.g. 3-bit. PAID-MSB and 6-bit PAID-MSB;
  8 PBSSID bits may be rotated (right or left-shifted) and the rotation counter follows the value of 3-bit PAID-MSB. E.g. if the value of 3 MSB PAID bits is 7, then 8 PBSSID will rotate (right-shift or left-shift) 7 times and the resulting rotated bits are used as MSB of ACK ID; and
  the remaining LSB of ACK ID is 6-bit PAID-LSB.

According to various embodiments, the bit-rotating approach of PBSSID bits based on AID value may be used for ACK ID based on scrambled PBSSID bits of NDP type frame. According to various embodiments, the bit-rotating approach of PBSSID bits based on AID value can be used for ACK ID based on TA bits of NDP type frame and resulting bits based on partial FCS and scramble seed of received beacon frame. According to various embodiments, the bit-rotating approach of PBSSID may be generalized as the indexing method where the index is based on some of known AID bits (all these bit positions should be known to both engaging AP and STA) and there may be an array of NDP PS-Poll RA (PBSSID) bits that are permutated by some bit arrangements that are also known to both AP and STA. In the example shown above, the indexing may use 3-bit PBSSID-LSB and the bit-rotation method may be used so that the complexity is low due to that both AP and STA don't need to remember the array of permutated PBSSID.

In the following, identifying ACK ID that is based on bit-rotation will be described. According to various embodiments, to decode ACK ID, the STA
  (1) Set test counter as zero;
  (2) Test whether 8-bit ACK ID-MSB matches the RA (8-bit PBSSID-LSB) bits in NDP PS-Poll previously sent and waits for acknowledgement;
  (3) If matched, test counter is 3-bit AID-MSB and then go to (7). If not matched, decide whether test counter is 7.
  (4) If the test counter is 7, declare ACK ID as invalid and end the decoding.
  (5) Otherwise, increase the test counter and go to (6).
  (6) Rotate (e.g. right-shift) the 8-bit ACK ID-MSB and go to (2) to continue the test.
  (7) Obtain 6-bit PAID-LSB from 6-bit ACK ID-LSB and recover 9-bit PAID from 3-bit PAID-MSB and 6-bit PAID-LSB.
  (8) Test whether PAID value is valid. If PAID bits are valid, ACK ID is valid. Otherwise, declare ACK ID as invalid.

CRC bits may be masked (bitwise XOR) with some bits of the identifier for pairing frame exchange (e.g. RA/TA/ACK ID bits), i.e. short response frame that acknowledges NDP type PS-Poll. Some of the identifier may be embedded inside CRC mask bits. CRC bits may be computed same as for Short Ack in but mask with some extra bits that are not in the short response frame SIG.

The indexing method (for example including bit-rotation) may be masked and a CRC mask may be used to generate ACK ID with a shorter length. For example, 14-bit ACK ID (option 4) may be considered and it may be assumed that PAID (partial AID) is used as TA for NDP PS-Poll. 9-bit PBSSID and 5-bit PAID-MSB may be used to construct ACK ID for short response frame SIG, and 4-bit PAID-LSB may be used to mask 4-bit CRC. When STA receives response frame SIG for its NDP PS-Poll, it may unmask CRC with its 4-bit PAID-LSB and compare the result with expected CRC bits that can be computed by the STA according to its NDP PS-Poll SIG being acknowledged. If matched, the short frame may be possible for itself and for further processing.

According to various embodiments, the CRC mask and indexing method may be combined to further relax the requirement on the number of ACK ID bits. 12-bit ACK ID (option 4) may be considered and it may be assumed that PAID is used as TA for NDP PS-Poll. 10-bit PBSSID may be used that is expanded by the AP and may also be known by the STA, and 5-bit PAID-MSB may be used to construct ACK ID for short response frame SIG, and 4-bit PAID-LSB may be used to mask 4-bit CRC. For example:
  When using 5-bit PAID-MSB, the first two bits may be used in ACK ID in addition to 10-bit PBSSID and the remaining 3 bits of PAID-MSB may be used as the index by AP to obtain the PBSSID.

An array of permutated 10-bit PBSSID may be determined/known by both AP and STA and the indexing method is used.

When STA receives short Ack, it first may unmask CRC bits in SIG with its own 4-bit PAID-LSB and calculate CRC for the remaining bits in SIG before checking the calculated CRC against the unmask CRC. If they are matched, STA may verify whether the received 10-bit PBSSID is correct by comparing it against its resulting 10-PBSSID that are obtained by using the value of its $3^{rd}$-$5^{th}$ PAID-MSB as the index to the array of permutated 10-bit PBSSID. Thus, STA may obtain $3^{rd}$-$5^{th}$ bit of PAID and 2-bit PAID-LSB from ACK ID in SIG, and verify with its own PAID bits.

The rotating method described above may be used to free AP and STA of storing the array.

In the following, an example will be described in which 12-bit ACK ID is acquired through CRC mask and bit-rotation that includes the information of partial AID (PAID). Firstly the AP may construct SIG with the following bits to compute CRC before CRC mask:

4-bit Type Indication;
ACK ID that is concatenated by rotated scrambled partial BSSID and 2-bit PAID-MSB; and
other SIG bits.

Figure 4:
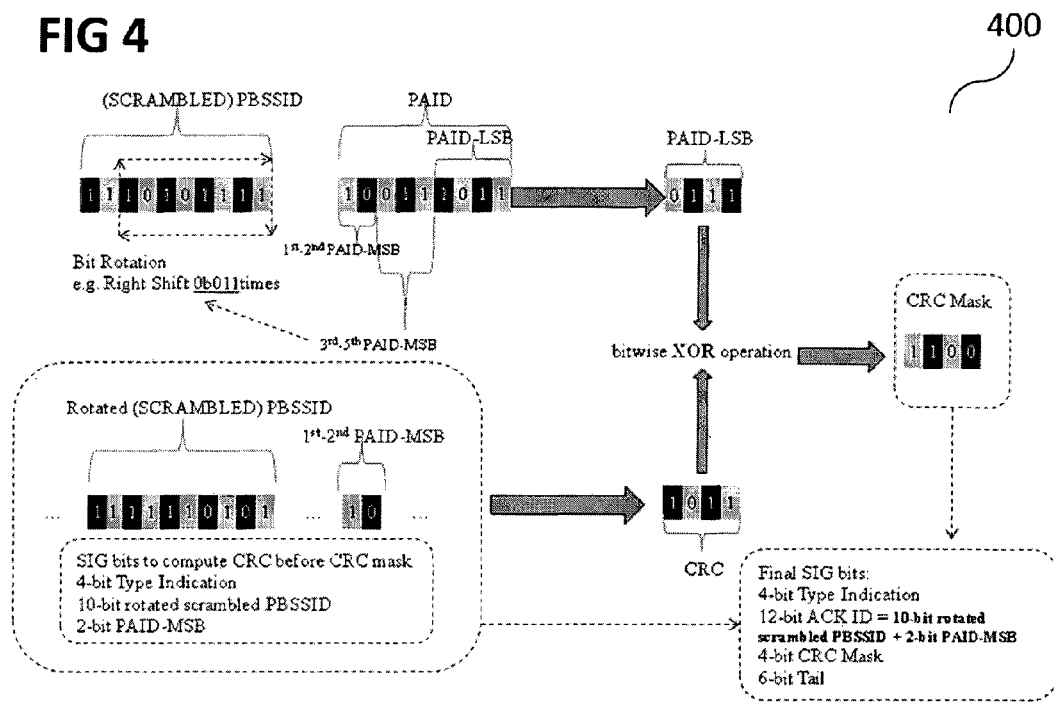
FIG. 4 shows an illustration of an example of Bit-rotating and CRC Mask.

FIG. 4 shows an illustration 400 of an example of Bit-rotating and CRC Mask. As shown in FIG. 4, 10-bit rotated scrambled PBSSID is obtained by AP expanding 9-bit scrambled PBSSID into 10-bit (which is agreed between AP and the STA) of which the first 2-bit scrambled PBSSID remains unchanged while the last 8-bit scramble PBSSID is bit-rotated (e.g. right-shifted) with the times that is determined by the value of 3-bit PAID-MSB i.e. $3^{rd}$-$5^{th}$ bits. After CRC is computed for these SIG bits, the 4-bit PAID-LSB is used to mask CRC results i.e. 4-bit PAID-LSB bitwise XOR operation with 4-bit CRC results.

To decode the SIG bits, firstly the STA may check type indication and then may unmask 4-bit CRC mask with its own 4-bit PAID-LSB. After unmasking, the STA may compute whether unmask CRC is correct for the SIG bits. If the CRC result is correct, the STA may proceed to decode ACK ID for scrambled PBSSID which is the first 10-bit of ACK ID. It may determine whether the rotated scrambled PBSSID is matched with its own pre-computed scrambled PBSSID after rotating these rotated scrambled PBSSID with the times that is the value of $3^{rd}$-$5^{th}$ bits of its own PAID-MSB. For example, if the value of $3^{rd}$-$5^{th}$ bits of its own PAID-MSB is 5, then scrambled PBSSID bits may be right-shifted 5 times by STA (while AP should left-shift 5 times scrambled PBSSID bits). If the above matches, the STA may obtain $11^{th}$-$12^{th}$ bits of ACK ID and may verify against its own $1^{st}$-$2^{nd}$ bits of PAID-MSB. If the above matches, the ACK ID may be correct and the STA consider it has been acknowledged positively.

In the following, Differentiating Short Acks for NDP Type and Non-NDP Type frames according to various embodiments will be described. According to various embodiments, short Acks for NDP type and non-NDP type may be differentiated through the identification bit(s) in SIG.

Figure 5:
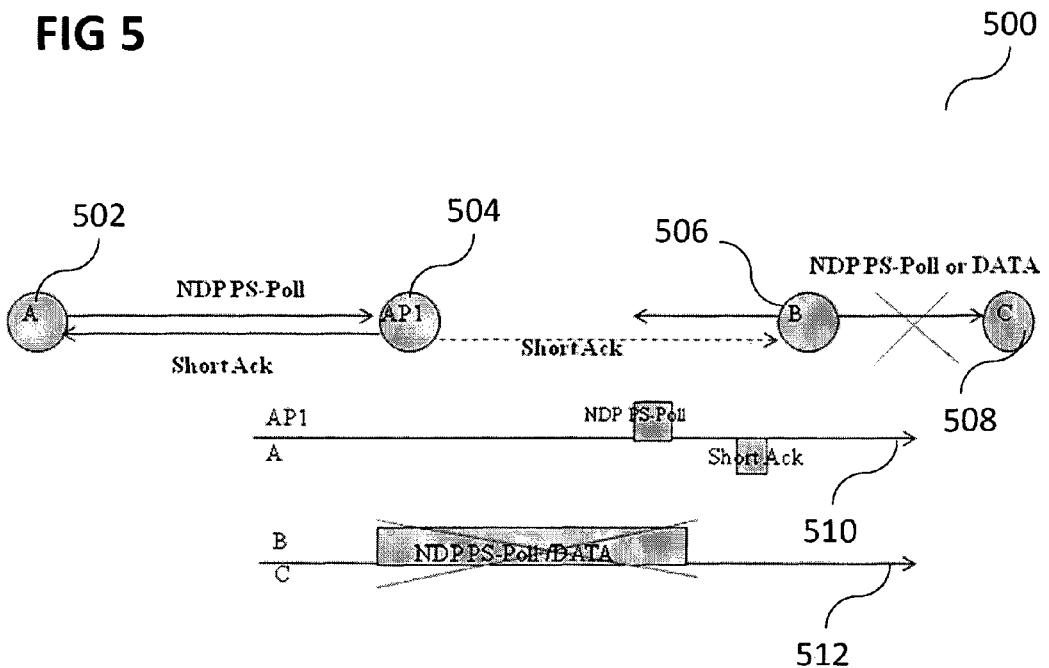
FIG. 5 shows an illustration of how false Short Ack may be avoided according to various embodiments.

FIG. 5 shows an illustration 500 of how false Short Ack may be avoided according to various embodiments. For example a first station 502 may send an NDP PS-Poll to a first AP 504, and this NDP PS-Poll may arrive at the first AP 504. Furthermore, a second station 506 may send another NDP PS-Poll to a further station 508 (for example a second AP), which may not arrive at the further station 508. Then, by differentiating short ACKs according to various embodiments, a short Ack from the first AP 504 to the first station 502 (like indicated by flow 510) may not lead to a false short Ack at the second station 506 (like indicated by flow 512).

ACK ID based on the scheme according to various embodiments may be used to identify short Ack frame to reduce the probability of a false short Ack that may be accepted by a transmitter B 506 if The intended receiver C 508 does not receive the NDP type PS-Poll or DATA correctly, and does not send short Ack.

Another STA A 502 is transmitting to AP1 504 with transmission ended at exactly the same time when B ends its transmission.

Transmission from B 506 is not able to interfere the transmission from A 502 to AP1 504, so that AP1 504 may send a short Ack to A 502; while short Ack can arrive at B 506 correctly.

Since B 506 is expecting short Ack from C 508, B 506 may accept the short Ack from AP1 504 by mistake.

Even if B 506 has a much shorter transmission range than AP1 504 and there is no protection for NDP PS-Poll, the probability of exact same ACK ID for NDP type PS-Poll is very low due to the good design of ACK ID.

But the duplication probability of ACK IDs for NDP type and non-NDP type frame may be not low due to the computation methods for these two kinds of ACK ID are different:

(1) Computation of ACK ID in short Ack for the received frame other than NDP type may be based on partial FCS and scrambling seed of received frame.

(2) Computation of ACK ID in short Ack for NDP PS-Poll may be based on partial FCS and scrambling seed of received beacon or RA bits and/or CRC bits of received NDP type PS-Poll frame, as described above.

Further, short Ack for NDP type (PS-Poll) frame may be differentiated from short Ack for non-NDP type frame using some identification bits in SIG so that the probability of confusing other data transmission may be low.

I. Upon receiving NDP type PS-Poll, AP may set the identification bits in short Ack to indicate that the frame is for NDP type PS-Poll, as the response to the PS-Polling STA.

II. Upon receiving short Ack, PS-Polling STA may identify the identification bits that signal the response frame is a short Ack for NDP type frame. It is to be noted that it is assumed the probability of duplicate identifier e.g. ACK ID for NDP type response to NDP type frame is fairly low due to the method for ACK ID computation according to various embodiments:

III. Once AP/STA receives short Ack, in addition to CRC checking, it may proceed with the related protocol as follows:

a. If AP/STA that is involved in the process using NDP type PS-Poll and short Ack receives other AP's short Ack for non-NDP type PS-Poll, it may identify whether it is a short Ack for NDP type frame.

i. If it is a short Ack for non-NDP type frame, AP/STA may discard.

ii. If it is a short Ack for NDP type frame, AP/STA may identify whether it is addressed to itself by using the identifier e.g. ACK ID field and/or other fields to determine whether the short Ack is addressed to it. If it is not addressed to itself, it may discard.

b. If AP/STA that is involved in the process using non-NDP type frame and short Ack receives other AP's short Ack for NDP type PS-Poll, AP/STA may identify whether it is a short Ack for non-NDP type frame.

i. If it is a short Ack for NDP type frame, AP/STA may discard.

ii. If it is a short Ack for non-NDP type frame, AP/STA may identify whether it is addressed to itself by using the identifier e.g. ACK ID field and/or other fields to determine whether the short Ack is addressed to it. If it is not addressed to itself, it may discard.

The method to differentiate short frame (e.g. short Ack) for NDP type and non-NDP type using some SIG bits according to various embodiments may be applied to other short frame similarly, if the design approaches of some of the fields are different.

In the following, Short CTS SIG Design will be described. In a Short CTS, the SIG field may include:

MCS-4 bits (use a different reserved value from short Ack);
Bandwidth (BW)-3 bits;
Duration-TBD bits;
CRC-4 bits;
Tail-6 bits (TBD);
CTS ID-<=9 bits (1 MHz); <=21 bits (2 MHz).

Short CTS may also be used as AP assisted medium synchronization frame, and short CTS frame reserves a time interval for a STA that is scheduled to wake up at the slot boundary (or TWT, i.e. Target Wake Time), with the SIG including RA field i.e. the address of the STA that is scheduled to wake up at the slot boundary.

Short CTS may consider CTS ID to address the receiver. For the case of RTS/CTS, CTS ID may be determined based on Partial FCS and scramble seed information from RTS. For the case of CTS-to-Self, CTS ID may be obtained from partial TA of the transmitter to address both TA and RA. It may be assumed that Short CTS uses RA field to address the receiver. This may create a problem whether we should differentiate the above 3 kinds of short CTS since the duplicate probability of CTS ID may be high.

Figure 6:
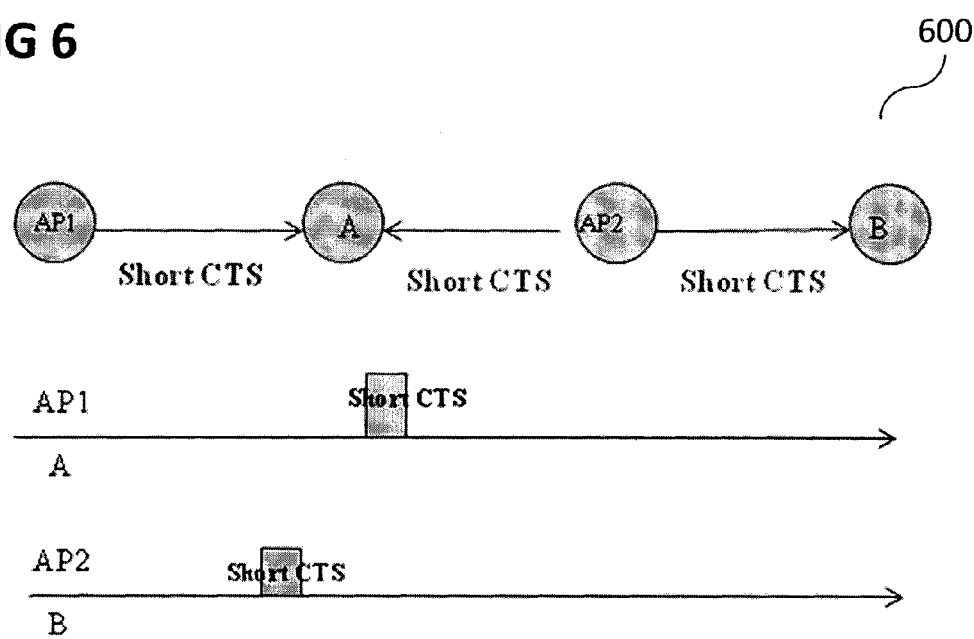
FIG. 6 shows an illustration of the example of false short CTS as medium synchronization frame.

FIG. 6 shows an illustration 600 of the example of false short CTS as medium synchronization frame. Both AP1 and AP2 send short CTS as medium synchronization frame and AP1 is A's associated AP. If short CTS from AP1 and AP2 have the same CTS ID or RA field, false case occurs. STA A can't tell which short CTS is the real medium synchronization frame that it should follow. In FIG. 6, STA A may regard AP2's short CTS addressed to STA B as medium synchronization frame that is addressed to itself from AP1.

Figure 7:
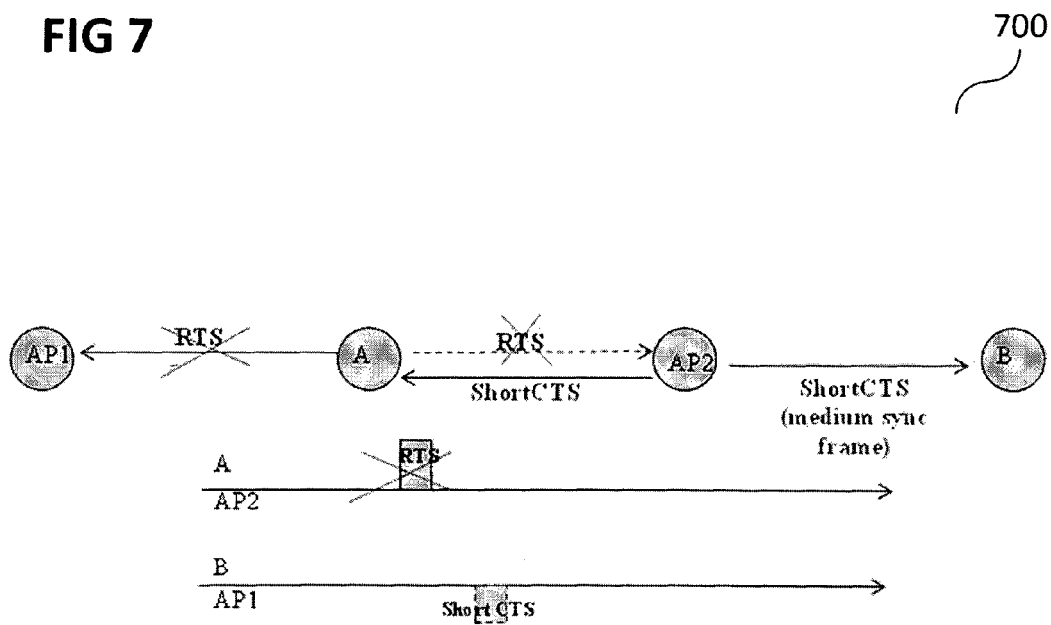
FIG. 7 shows an illustration of the example of false short CTS for medium synchronization frame and RTS/CTS.

FIG. 7 shows an illustration 700 of the example of false short CTS for medium synchronization frame and RTS/CTS. STA A sends RTS to AP1 and expects a short CTS from AP1 as the response to its RTS and STA B expects a short CTS from AP2 as the medium synchronization frame. Suppose that AP1 didn't receive RTS or receive a corrupted RTS that AP2 also can't receive or receive a corrupted version, but AP2 transmits Short CTS to B as the medium synchronization frame. The possibility of this false short CTS case could be high if CTS ID/RA field for RTS/CTS and medium synchronization frame short CTS is identical.

If CTS ID and RA are unified for the above two cases, then only PAID or partial STA's MAC address is possible, since there may be no preceding frame before AP sends medium synchronization frame. When PAID or partial STA's MAC address is used, the duplicate probability is high due to they are not unique among different APs and there are many STAs that may have the same CTS ID or RA field. Another duplicate case is that CTS ID for CTS-to-self may confuse $3^{rd}$ party STAs doing RTS/CTS handshaking based on short CTS, when partial TA bits are used as CTS ID that is same as that in short CTS for RTS/CTS handshaking.

Type indication may be provided, wherein one bit (TBD) or some reserved case for a field (e.g. BW (bandwidth)) in SIG is used to differentiate two types of short CTS: short CTS as the medium synchronization frame and short CTS for RTS/CTS handshaking and CTS-to-self. For example, notice that BW=1, 2, 4, 8, 16 MHz, only 3 bits are required. 3 unused cases may occur for 3-bit BW and can use one such unused case to indicate that short CTS is used as the medium synchronization frame. Further, unused case may be used for short CTS used as CTS-to-self. There may be a need to define one field to indicate whether short CTS is from AP. There may be one bit defined to differentiate whether short CTS is from its AP. If the frame is a broadcast synchronization frame (not addressed to a particular STA), we can set DURATION field value as 0.

Two design options for short CTS SIG may be provided as follows.

Option 1 may be as follows: Short CTS is designed only for >=2 MHz. Define the following fields in SIG: RA and TA, in addition to the fields that may include Type Indication, BW, DURATION, CRC, Tail. E.g. RA is 9 bits, TA is 9 bits. We can define one field to indicate whether short CTS is from AP. For AP, when AP responds to the STA's RTS, use PAID as RA and use Partial BSSID or the computation resulting bits based on Partial FCS and scramble seed information from RTS as TA; when AP sends CTS-to-itself, use a reserved PAID (e.g. 0) as RA and use Partial BSSID as TA; when AP responds to the STA with medium synchronization frame, use PAID as RA and use Partial BSSID as TA; when AP broadcasts medium synchronization frame, use reserved PAID e.g. 0 as RA and use Partial BSSID as TA. For STA, when STA responds to AP's RTS, use PAID as TA and use Partial BSSID or the computation resulting bits based on Partial FCS and scramble seed information from RTS as RA; when STA sends CTS-to-itself, use its PAID as TA and use Partial BSSID as RA. The handling of short CTS should include the step to identify whether the frame is from AP and decide whether it is addressed to itself. There may be one bit defined to differentiate whether short CTS is from AP Option 2 may be as follows: Short CTS is designed such that is same for 1 MHz and >=2 MHz case, by embedding the PAID information into CRC bits and CTS ID. If BW field is not used for medium synchronization frame, re-define 3-bit BW for 3-bit PAID-MSB ($1^{st}$-$3^{rd}$ bit of PAID). Use bit-shifted PBSSID as CTS ID. Note that bit-shifted PBSSID is the value of PBSSID right or left-shifted X times, where X is the value of 2-bit PAID-MSB ($4^{th}$ and $5^{th}$ bit of PAID). Mask (bitwise XOR) CRC with 4-bit PAID-LSB ($6^{rd}$-$9^{th}$ bit of PAID). The above methods of CRC mask and bit-rotation operation have been described above. The handling protocol for CTS ID is similar to that for ACK ID that is based on CRC mask and bit-rotation as described above.

a) When the frame is a broadcast synchronization frame (not addressed to a particular STA), we can set DURATION field value as 0 and set PAID as 0 to compute CTS ID. The approach can be applied to the case of short CTS for CTS-to-self, where the STA/AP will set its partial MAC address as CTS ID and the STA use its PAID to do CRC mask and bit-rotation while the AP use 0 as PAID to do CRC mask and bit-rotation. Note that in these cases, the STA with the same partial MAC address may be required to send non-NDP CTS frame rather than short CTS. This can be done when the STA perform authentication/association or through other frame exchange between AP and STA.

b) When the frame is a synchronization frame addressed to a specified STA, the DURATION field value may be set as the estimated time interval reserved for that STA and use the STA's PAID to compute CTS ID. The approach can be applied to the case of short CTS for RTS/CTS handshaking.

c) The problem with this design is that direct RTS/CTS handshaking between two STAs may not be supported, as PBSSID may mix up with the PAID, if it is unable to tell the difference between two CTS IDs from the STA and the AP respectively. In this case, we can avoid this duplicate case by reserving the PAID value that is same as PBSSID. This reserved PAID value is not assigned to any STA. Alternatively, if AP allocates the PAID value that is identical to PBSSID to a STA, AP should request the STA to send normal CTS rather than NDP short CTS.

In the following, Ack Indication according to various embodiments will be described.

In the following, without causing ambiguity, normal frame may refer to the frame format in the current IEEE 802.11 standard (IEEE 802.11-2012). For example, normal ACK/BA refers to the ACK/BA in the current 802.11 standard.

IEEE 802.11-1137-11-00ah-specification-framework-for-tgah, Mingyong Park, "IEEE 802.11ah Specification Framework" specifies that the SIG shall include 2-bit Ack Indication (00: Ack; 01: BA; 10: No Ack; 11: a frame that is not ACK, BA or CTS) in SIG and the definition of value (b11) for response frame type is used to indicate the presence of a frame that is not ACK, CTS or BA immediately following current transmission.

One of the key issues for 2-bit Ack Indication (assume Ack Indication is the field(s) that are used to indicate the response frame) is that some frame that is currently transmitted may have different response types following it. One example is that PS-Poll may allow a few options such as short Ack, normal ACK with timer indication and active polling response (assume that active polling response is sent immediately after SIFS (Short Interframe Spacing)). Therefore, this kind of frame may incur the difficulties in determining the response type for the Ack Indication at the unintended STAs due to the ambiguity of using the accepted 2-bit Ack Indication. If the STA decides 2-bit Ack Indication for its PS-Poll that is being transmitted, the peer STA (for example the AP in this case) may follow the indication to give the right response type. This may mean that the AP may not have the freedom to decide which type of response frame it can send as the reply. It is to be noted that polling response has to be of fixed size in order to make the unintended STA set the NAV (network allocation vector) or deferred channel access time correctly without ambiguity.

The process of determining the response type when there are multiple options could be either that the AP broadcasts its capability of handling the response types if there are multiple options in the beacon frame or negotiates with the STAs through some management frames e.g. authentication/association frames. After that, the STA may follow the decision made earlier to send the frame with the indicated response type. Upon receiving the frame with the response type indication, the AP may respond according to the type without ambiguity.

The key issue may be that the draft specification does not include enough options to support all these different response types. As only short Ack, normal BA, no Ack and long response other than ACK, BA and CTS are supported in 2-bit Ack Indication, when both short Ack/short BA and normal ACK/normal BA are used in the network or different networks, an issue may be encountered on how to set a proper network allocation vector (NAV) or deferred channel access time for the unintended STA, namely $3^{rd}$ party STA.

NAV may be an indicator, maintained by each STA, of time periods when transmission onto the wireless medium (WM) is not initiated by the STA regardless of whether the STA's clear channel assessment (CCA) function senses that the WM is busy. The current 802.11 standard may set up some protection mechanism which attempts to update the NAV of all receiving STAs prior to the transmission of a frame that might or might not be detected as valid network activity by the PHY (physical, for example physical layer) entities at those receiving STAs.

In the current IEEE 802.11 standard, a STA that receives at least one valid frame within a received PSDU may update its NAV with the information from any valid Duration field within that PSDU for all frames where the new NAV value is greater than the current one, except for those where the RA is equal to the MAC address of the STA.

Figure 8:
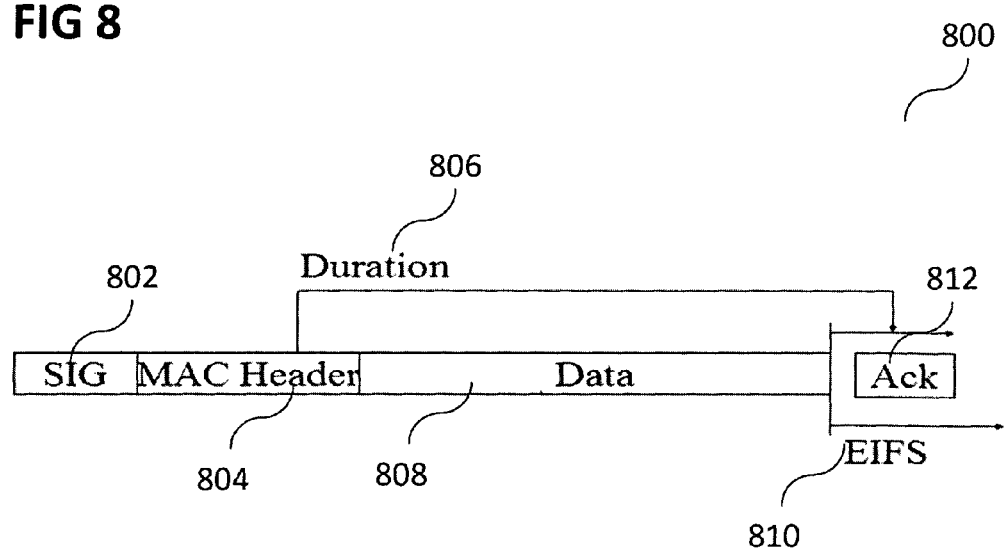
FIG. 8 shows an illustration of a NAV setting in the current 802.11 standard.

FIG. 8 shows an illustration 800 of a NAV setting in the current 802.11 standard.

As shown in FIG. 8, if an unintended STA decodes the duration field 806 in the MAC header 804 correctly, it sets NAV according to the duration field 806 value. Otherwise, it shall defer EIFS 810 or EIFS-DIFS+AIFS[AC] before transmission, where AC is the Access Category of the STA. In order to save power, an unintended STA can choose to check SIG field 802 and/or MAC header 804 (e.g. RA field) only, and skip the remaining fields 808 of the frame. However, the STA cannot verify the correctness of the duration field and Ack policy field in MAC header, without checking CRC. In some cases, an unintended STA may be able to decode SIG field 802 correctly, but cannot decode MAC header and Data field. For these cases, the STA has to apply EIFS 810 to set NAV. However, it might be unfair or insufficient to use EIFS because an MPDU/MMPDU may not have an ACK, EIFS (Extended IFS) accounts for the worse case ACK 812 duration, which can be significant longer than the actual ACK duration, EIFS protection may not be sufficient to protect a BA (block acknowledgement; 32 bytes), which is much longer than an ACK (14 bytes). Therefore, IEEE 802.11-1137-11-00ah-specification-framework-for-tgah adds two-bit Ack indication in SIG field to indicate whether an immediate response is requested right after the PPDU, and also the type of the response.

An unintended STA that detects the SIG correctly shall defer transmission until after the expected response (if present). As the data rate of the response frame is usually the same as that of the frame that elicited the response, if the frame size of response frame is known, the $3^{rd}$ party STA is able to defer its channel access according to the Ack Indication field of the received frame. For the case of the response frame that is short frame such as short Ack and short BA, the duration for deferred channel access at the $3^{rd}$ party STA is fixed and the same for the same channel bandwidth. For the case of the response frame that is normal frame such as normal ACK and normal BA, the duration for deferred channel access can be calculated based on the ACK (14 bytes)/BA length (32 bytes) and expected transmission rate (equivalent to the data transmission rate), which is usually the same as the frame that elicited the response. The expected data rate is dependent on the preamble type (1M Hz or >=2M Hz) and MCS (Modulation and Coding Scheme) of the received frame etc. For the case of Ack Indication set to No Response, the deferred channel access time is zero (the STA may start the transmission SIFS time after the response frame with a necessary backoff).

The general protocol/procedure for handling Ack Indication can be summarized as follows:

The transmitting STA (transmitter) may set Ack Indication and may set the response type accordingly.

Upon receiving the SIG with IFFI or 2-bit Ack indication or 3-bit Ack indication or other indication that can be used to infer the response type and whether it is short frame or normal frame, the receiver (the intended STA) shall follow the instruction as indicated to transmit the corresponding response type and $3^{rd}$ party STA shall set its NAV or deferred channel access time according to the response type and whether it is short frame or normal frame:

o) If a short frame is used, its duration is fixed.

o) If a normal frame is used, the duration can be calculated based on the length (e.g. the length of BA is 32 bytes) and expected transmission rate (equivalent to the data transmission rate).

o) If the response type is not ACK, BA or CTS, the duration can be regarded as (aPPDUMaxTime+2*aSIFSTime+aPHY-RX-START-Delay), as shown in the case of speed frame exchange.

Including 2-bit Ack Indication (00: short Ack/short BA; 01: normal BA; 10: No Ack; 11: a frame that is not ACK, BA or CTS) in SIG may not be sufficient to support different options for the response type to PS-Poll. If the response to PS-Poll is short Ack or polling response, we can set 2-bit Ack Indication in the SIG of PS-Poll as the value b00 and b11 respectively.

If normal ACK has the same length as polling response, we can define 2-bit Ack Indication (00: short Ack/short BA; 01: polling response/normal ACK; 10: No Ack; 11: a frame that is not ACK, BA, CTS and polling response). Normal BA is used only in TXOP, where the value b11 can be used to indicate.

The solution to solve the problem of insufficient bits for Ack Indication or ambiguity caused by 2-bit Ack Indication can combine the techniques or the steps in various embodiments.

Figure 9:
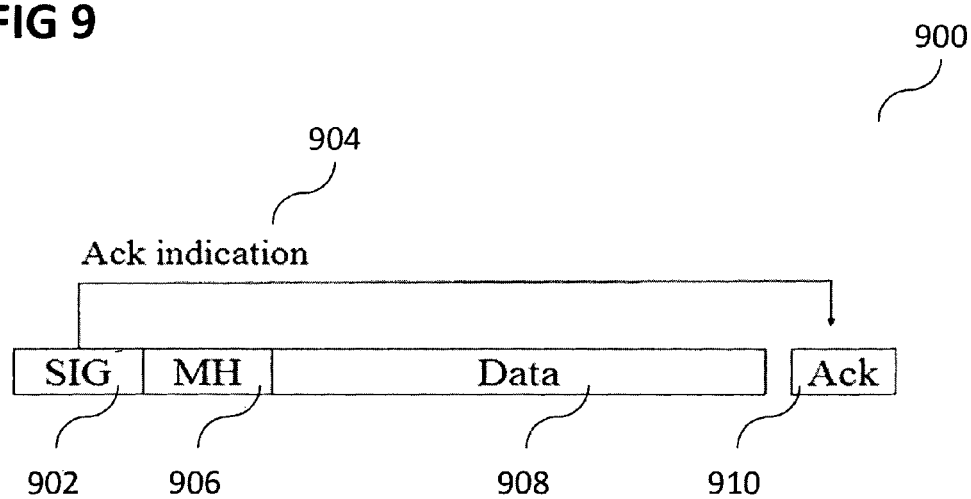
FIG. 9 shows an illustration for Ack Indication in SIG.

FIG. 9 shows an illustration 900 for Ack Indication in SIG (wherein MH may stand for MAC Header 906). For example, an Ack indication 904 may be provided in a SIG field 902. Further data 908 may be provided after the SIG field 902 and the MH 906. The indicated Ack 910 is also shown in FIG. 9.

There may be several advantages for the design according to various embodiments. The Ack indication according to various embodiments may provide sufficient protection against hidden terminals (to the intended receiving STA) and prevents unintended STAs from waiting for EIFS when no Ack is required. SIG may be more reliable than MAC header. The Ack indication may be quickly verified by SIG CRC (it is not required to decode the whole MPDU (MAC protocol data unit)).

When only four choices (including short Ack and normal BA (block acknowledgement)) are considered, the 2-bit Ack Indication may achieve the goal. But since short BA may also be accepted, it may be likely that both short BA and normal BA will be used. It may also be noted that the introducing of short ACK cannot exclude the use of normal ACK in some cases such as speed frame exchange, for example as described in IEEE 802.11-1137-11-00ah-specification-framework-for-tgah. The draft specification may include the concept of speed frame exchange based on the use of More Data field and 2-bit Ack Indication (b11) that indicates the presence of the frame immediately following current transmission (The meaning of "immediately following current transmission" may be that the following frame transmission occurs immediately after SIFS, which is the allowed shortest inter-frame space, rather than DIFS). This may mean that normal ACK may be used for speed frame exchange, as short Ack doesn't have 2-bit Ack Indication.

Figure 10:
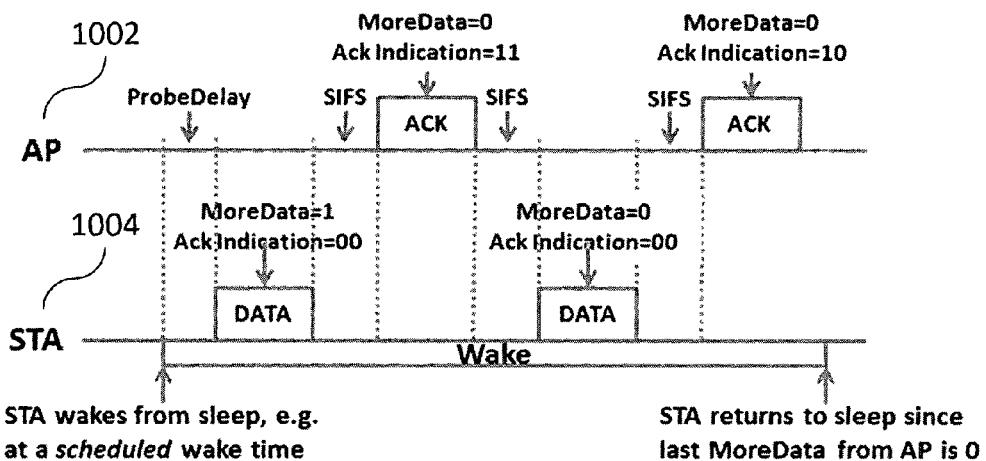
FIG. 10 shows an illustration of an example of speed frame exchange using normal ACK.

FIG. 10 shows an illustration 1000 of an example of speed frame exchange using normal ACK. Data processing 1002 of an access point (AP) and data processing 1004 of a station STA are shown. The station (non-AP STA or simply STA) may have only uplink data to transmit to AP. Firstly, STA sends its uplink (UL) data with More Data field in MAC header set to 1 and 2-bit Ack Indication in SIG set to b00 to indicate the presence of normal ACK immediately after the current transmission. Therefore the data frame after normal ACK can be sent after aSIFSTime without backoff, as it is assumed that UL data with More Data field=1 in MAC header indicates that there will be one more data frame following normal ACK. In fact, this protocol doesn't differentiate the short Ack from normal ACK. Upon receiving the current transmitted frame, the STA can determine the duration for current frame transmission either through the fields of Length/Duration in SIG and MAC header for data frame or short frame (i.e. NDP frame, e.g. including STF, LTF1 and SIG only. For instance, short Ack is a kind of short frame).

The unintended STA that can decode SIG and MAC header correctly can set its NAV or deferred channel access time to (aPPDUMaxTime+2*aSIFSTime+aPHY-RX-START-Delay) if a data frame is used as the response frame immediately after the previous data frame which carries the 2-bit Ack Indication value as b11. However, for the unintended STA that can decode SIG correctly but decode MAC header wrongly, it is not able to identify whether there will be a frame of either normal ACK or short ACK immediately following current transmission. Upon receipt, the unintended STA can set its NAV or deferred channel access time to a duration corresponding to a short Ack or normal ACK if a frame is used as the response frame immediately after the previous data frame which carries the 2-bit Ack Indication value as b00. For the case of short ACK, NAV or deferred channel access time can be set as (short ACK duration+2*aSIFSTime+aPHY-RX-START-Delay). For the case of normal ACK, NAV or deferred channel access time can be set as (normal ACK duration+2*aSIFSTime+aPHY-RX-START-Delay). In the above both cases, the unintended STA cannot identify whether there will be a normal ACK or short Ack immediately following current transmission based on 2-bit Ack Indication, which is used to represent both short Ack and normal ACK. It is to be noted that short frame/normal frame duration (e.g. short Ack/normal ACK duration) refers to transmission time of short frame/normal frame.

Due to that normal ACK and short BA may be used as well, an unintended STA, after receiving and decoding SIG correctly, may not be able to calculate the accurate response duration by the response type and/or the expected response transmission rate. This issue may be solved.

As normal ACK and normal CTS have the same size, the value of 2-bit Ack Indication used to indicate for normal ACK can be also used for normal CTS. This can be applied to poll response if it has the same size as that of normal ACK.

When short frame (STF+LTF1+SIG only, without MAC header, namely NDP frame, e.g. short Ack) is used, if the type of the frame immediately following short frame is indicated in short frame, 2-bit Ack Indication protocol may be applied to the Access Point (AP) and STA.

According to various embodiments, Ack Indication may be provided to remove the ambiguity, like will be described in more detail below.

According to various embodiments, processing as will be described in the following may be provided. Currently, there may be 4 reserved bits in SIG. One reserved bit (defined as Immediate Following Frame Indication, i.e. IFFI) may be used to instruct the intended STA that a short frame (e.g. short Ack/short BA) shall be used immediately following current transmission, where IFFI=0 indicates a short frame (e.g. short Ack/short BA) immediately following current transmission and IFFI=1 indicates a normal frame (e.g. normal Ack/normal BA) immediately following current transmission. We can include 2-bit Ack Indication for four options e.g. 00: Ack; 01: BA; 10: No Ack; 11: a frame that is not ACK, BA or CTS.

According to various embodiments, processing as will be described in the following may be provided. According to various embodiments, it may not be required to change current draft specification for the definition of 2-bit Ack Indication but a rule may be set on how to set the NAV or deferred channel access time for $3^{rd}$ party STA i.e. the unintended STA: upon decoding 2-bit Ack Indication correctly, $3^{rd}$ party STA shall set NAV or deferred channel access time to the duration corresponding to that for normal frame (e.g. normal ACK, which has a frame size larger than NDP ACK) although channel access time is wasted in this case. $3^{rd}$ party STA can set its NAV or deferred channel access time based on the length of normal frame (e.g. the length of ACK is 14 bytes) and expected transmission rate (equivalent to the data transmission rate). However, Ack Indication becomes not very useful as the NAV or deferred channel access time is set as (ACKTxTime+2*aSIFSTime+ aPHY-RX-START-Delay) upon receiving current transmission, which is a bit better than that via EIFS protection rule, where EIFS=aSIFSTime+DIFS+ACKTxTime. It is to be noted that those unintended STAs that want the more efficient channel access have to continue to receive the immediate frame following current transmission and it is obvious that they cannot benefit from the NAV or deferred channel access time setting rule.

According to various embodiments, processing as will be described in the following may be provided. According to various embodiments, it may not be required to change the current draft specification for the definition of 2-bit Ack Indication but a rule may be set on how to set the NAV or deferred channel access time for $3^{rd}$ party STA. Upon decoding 2-bit Ack Indication correctly, $3^{rd}$ party STA shall set NAV or deferred channel access time to the duration corresponding to short frame (e.g. short ACK duration+ 2*SIFSTime+aPHY-RX-START-Delay) and should continue to receive the next frame immediately following the current transmission (in this case STA consumes more power but channel access time is improved, early Ack indication becomes not effective). This suggests that $3^{rd}$ party STA may have to receive the SIG of the immediately following frame; otherwise, when normal ACK is used, the unintended STA that starts to sense the channel after the duration equal to the value of NAV or deferred channel access time is not able to decode normal ACK so that they may have to apply EIFS to set NAV. Once the SIG of the frame (e.g. either normal ACK or short Ack) immediately following current transmission is received, $3^{rd}$ party STA can set its NAV or deferred channel access time correctly by checking whether the frame is normal frame, and if the frame is short frame, it can set the NAV or deferred channel access time by looking into Length/Duration and MCS in SIG; otherwise it is straightforward to know the fixed duration of NDP frame.

According to various embodiments, processing as will be described in the following may be provided. According to various embodiments, 2-bit Ack Indication may be redesigned, i.e. 3-bit Ack Indication may be used instead. Various embodiments may include 3-bit Ack Indication (e.g. 000: short frame e.g. short Ack/BA/CTS; 001: normal Ack/CTS; 010: normal BA; 011: No Ack; 100: Polling response; 101: a frame that is not ACK, BA, CTS and Polling response; 110-111 Reserved) in SIG so that the presence of response frame type (e.g. normal frame or short frame) immediately following current transmission can be easily identified without ambiguity.

Alternatively if a unified frame format for normal ACK and polling response, which have the same length, may be provided, 3-bit Ack Indication (e.g. 000: short frame e.g. short Ack/BA/CTS; 001: normal Ack/CTS/Polling Response; 010: normal BA; 011: No Ack; 100: a frame that is not ACK, BA, CTS and Polling response; 101-111 Reserved) may be included.

According to various embodiments, processing as will be described in the following may be provided. According to various embodiments, 2-bit Ack Indication may be redesigned, i.e. include 2-bit Ack Indication (00: short frame e.g. short Ack/short BA/short CTS; 01: normal Ack; 10: No Ack; 11: a frame that is not ACK, BA or CTS) in SIG, by combining the indication for short Ack/short BA and excluding the use of normal BA (but we can allow to use normal BA in TXOP (Transmit. Opportunity) where the preceding frame immediately followed with normal BA should set Ack Indication to b11, for example when normal BA is not with a fixed length or is transmitted with a rate different from the received frame that elicited the response).

In the following, a method for fast frame forwarding according to various embodiments will be described.

In the current IEEE 802.11 standard, when the data packets are long, the RTS/CTS messages may be used to reserve the media for transmission. However, it is performed within one hop.

When relay is introduced, if the current design is used, two RTS/CTS transactions may be required. The overhead could be heavy and it may also lower down the media transmission efficiency. According to various embodiments, various RTS/CTS message exchange methods are provided to protect two-hop transmissions that involves relay.

For example, and without loss of generality, it may be assumed that the STA is two hops away from the AP.

According to various embodiments, processing as will be described in the following may be provided. One of the relaying scenarios considered in the 802.11ah standard is that both AP and station can hear each other. However, to save transmission power of STA, a relay station may be used by STA for uplink data forwarding. In such scenario, the STA may send RTS to AP directly but the reserve media duration includes both transmission durations required by STA and relay. After receiving the CTS from AP, waiting for a short duration such SIFS, STA started to transmit data packet to relay, with relay indication in the data frame, either in the MAC frame control header or in the SIG. Relay may forward the packet to AP using the reserved channel time by STA using the RTS/CTS.

When the relay station receives RTS from STA, it may check the TA and RA field of the RTS and know whether the STA is served by the relay at the moment.

The STA may use some bits in the SIG/FC to indicate whether frame forwarding time required by relay is included in the RTS duration. If time is included, the relay station of the STA which sends the RTS shall update its NAV and also aware that it is required to use the reserved media to forward data frame from STA to AP if CTS is sent out by the AP to confirm the media reservation. It may not be allowed to use the reserved time to transmit frames other than the frame from STA that shall be forwarded to the AP later.

The relay station may verify whether the CTS received is the one replied to the RTS send by its subordinate STA. If CTS is a full CTS, the relay can derive the CTS is for the RTS sent by its subordinate STA earlier. If CTS is a short CTS, the station shall verify the CTS ID in short CTS to determine whether it is the one reply to the RTS from its STA.

According to various embodiments, processing as will be described in the following may be provided. The STA sends RTS to the relay and the relay further send an RTS to AP. For example, after receiving RTS from relay, AP reply with CTS to relay and relay further send CTS to STA. Most of the fields such as source and destination address, or CTS ID (when short CTS is used) can be reused. One bit in the RTS from STA to relay may indicate that a relaying of RTS may happen. The destination address in the RTS can be either the MAC address of relay or the MAC address of the AP. The source address in the RTS from relay to AP may be the MAC address of relay or the MAC address of STA. When short CTS is used, for the CTS from AP to STA, a relay bit may be set so that relay station will send the CTS to STA.

According to various embodiments, processing as will be described in the following may be provided. In case STA can hear from AP directly, RTS/CTS procedure defined as described in the following may be used. The STA may send RTS to relay first and relay may send a second RTS to AP. After receiving RTS from relay stations, the AP may send CTS to media. After receiving the CTS, the STA may send data over the reserved media.

According to various embodiments, processing as will be described in the following may be provided. In case STA can hear from AP directly, the RTS/CTS procedure defined as described in the following may also be used. STA may send RTS to relay first and relay may send CTS with relay bit to AP. After receiving CTS from Relay stations, AP may send CTS message to media. The CTS sent by the AP can be the same one as received from relay. After receiving the CTS, the STA can send data over the reserved media.

To realize the above described embodiments, it may be necessary to define one Relay bit or indication in RTS SIG/Frame Control field in MAC header to indicate that this RTS is required to be relayed to AP or being replied by Relay e.g. with (short) CTS.

The CTS sent can be a short CTS or other format with transmitted address and receiver address. Ack Indication in RTS (from STA to Relay) SIG may be set to a specified value e.g. b00 (indicating a short CTS frame is the immediate response).

For short CTS from Relay to AP, one IRFI (Immediate Response Frame Indication; the function may be similar to ACK Indication or IFFI) field may be defined to indicate where there will be a short frame following Short CTS. IRFI=0 may indicate there will be a short frame (e.g. short CTS) following Short CTS. IRFI=1 indicates there will be a Data frame (non-NDP) following Short CTS. For CTS from relay to AP, IRFI is set to 0. Duration is set to the Duration field value in RTS−SIFS−Short CTS duration. CTS ID may be based on the scrambling seed and FCS of received RTS and/or STA's AID and/or Partial BSSID or AID of Relay as well as AP's BSSID. For example, bitwise XOR operation on the computation results of the scrambling seed and FCS of received RTS, partial BSSID of Relay and partial BSSID of AP can create CTS ID carrying three parties' information.

Once STA receives Short CTS (sent by Relay), if IRFI=0, STA may defer channel access after SIFS+Short CTS Duration. Once AP receives Short CTS (sent by Relay) and if IRFI=0 and CTS ID is matched, AP will send short CTS.

For Short CTS from AP to Relay/STA, IRFI may be set to 1 and Duration may be extended according to its knowledge on the data rate between AP and Relay.

In the following, response frame indication in SIG and speed frame exchange using short Ack according to various embodiments will be described.

The draft specification IEEE 802.11-1137-11-00ah-specification-framework-for-tgah, Mingyong Park, "IEEE 802.11ah Specification Framework" includes 2-bit Ack Indication (00: Ack; 01: BA; 10: No Ack; 11: a frame that is not ACK, BA or CTS) in SIG. The definition of value (b11) response frame type may indicate the presence of a frame that is not ACK, CTS or BA following current transmission.

According to various embodiments, modification for the above may be provided. For example, Ack Indication for Short Ack can be used for other NDP frames as they have the same size for same Bandwidth, and Ack Indication for ACK can be used for CTS (CTS has the same size as ACK). However, an issue may be encountered on how to set a proper Ack indication and NAV (defer channel access) when both short Ack/BA and normal ACK/BA are possible to be used in the networks. When only short Ack and BA are used, the use of 2-bit Ack Indication in the draft specification can achieve the goal. The draft specification considers only normal BA. Since short BA is accepted in the draft specification, it is likely that both short BA and normal BA will be used. The design of short ACK can't exclude the use of normal ACK in some cases such as speed frame exchange. Due to that normal ACK and BA may be used as well, an unintended STA when receiving and decoding SIG correctly may not be able to calculate the accurate response duration by the response type and/or the expected response transmission rate.

According to various embodiments, various options may be provided, like will be described in more detail below.

According to various embodiments, an option which may be referred to as Option A may be provided as follows: 2-bit Ack Indication may be included in SIG to indicate the following frame type/size:
  00: NDP frame;
  01: ACK (or a MAC frame with the same size as ACK, e.g. CTS);
  10: No Ack;
  11: a frame that is not NDP frame, ACK or CTS.
  The indication of 00 may combine the indication for short Ack/short BA/short CTS;
  ACK may be different from short Ack;
  Use 11 for normal BA;
  If the length of normal BA is not fixed, it is suitable to use 11 to indicate the following frame is normal BA.

According to various embodiments, an option which may be referred to as Option B may be provided as follows: Include 2-bit Ack Indication in SIG to indicate the following frame type/size:
  00: NDP frame;
  01: a frame with the MAC frame size <=X;
  10: No Ack;
  11: a frame with the MAC frame size >X;

X is decided by the size of the frame that is used frequently. e.g.
if normal ACK is used, X can be set as the size of normal ACK (Option A is the same as Option B);
if normal BA is used, X can be set as the size of normal BA (if it is fixed);
3rd party STA may set it NAV or deferred channel access time corresponding to the frame with the size X (i.e. aSIFSTime+frame duration for size X) for channel access if Ack Indication=01.

According to various embodiments, an option which may be referred to as Option C may be provided as follow: Use 3-bit Ack Indication:
000: NDP frame;
001: normal Ack/CTS (and other frame with the same MAC frame size);
010: No Ack;
011: normal BA; (use 011 for BA if fixed length. Otherwise, use 100 for normal BA);
100: a frame that is not NDP frame, ACK, BA or CTS;
101-111 Reserved (May use 111 to indicate that the frame is to be relayed or being relayed).

According to various embodiments, an option which may be referred to as Option D may be provided as follows. Various embodiments do not require to change current draft specification for the definition of 2-bit Ack Indication but we need to set a rule on how to set the NAV or deferred channel access time for $3^{rd}$ party STA i.e. the unintended STA: upon decoding 2-bit Ack Indication for normal frame such as ACK correctly, $3^{rd}$ party STA shall set NAV or deferred channel access time to the duration corresponding to that for normal frame (e.g. normal ACK, which has a frame size larger than NDP ACK) although channel access time is wasted in this case. $3^{rd}$ party STA can set its NAV or deferred channel access time based on the length of normal frame (e.g. the length of ACK is 14 bytes) and expected transmission rate (equivalent to the data transmission rate). However, Ack Indication becomes not very useful as the NAV or deferred channel access time is set as (ACK duration+aSIFSTime) upon receiving current transmission, which is a bit better than that via EIFS protection rule, where EIFS=aSIFSTime+DIFS+ACK duration. It is to be noted that those unintended STAs that want the more efficient channel access have to continue to receive the immediate frame following current transmission and it is obvious that they cannot benefit from the NAV or deferred channel access time setting rule.

According to various embodiments, an option which may be referred to as Option E may be provided as follows. Various embodiments do not require to change the current draft specification for the definition of 2-bit Ack Indication but we need to set a rule on how to set the NAV or deferred channel access time for $3^{rd}$ party STA. Upon $3^{rd}$ party decoding 2-bit Ack Indication for normal frame such as normal ACK correctly, STA shall set NAV or deferred channel access time to the duration corresponding to short frame (e.g. short ACK duration+SIFSTime) and should continue to receive the next frame immediately following the current transmission (in this case STA consumes more power but channel access time is improved, early Ack indication becomes not effective). This suggests that $3^{rd}$ party STA may have to receive the SIG of the immediately following frame; otherwise, when normal ACK is used, the unintended STA that starts to sense the channel after the duration equal to the value of NAV or deferred channel access time is not able to decode normal ACK so that they may have to apply EIFS to set NAV. Once the SIG of the frame (e.g. either normal ACK or short Ack) immediately following current transmission is received, $3^{rd}$ party STA can set its NAV or deferred channel access time correctly by checking whether the frame is normal frame, and if the frame is short frame, it can set the NAV or deferred channel access time by looking into Length/Duration and MCS in SIG; otherwise it is straightforward to know the fixed duration of NDP frame.

In the following, handling Ack indication according to various embodiments will be described:
Upon receiving the SIG with Ack indication that can be used to infer the response type and whether it is NDP frame or normal frame,
the intended STA shall follow the instruction as indicated to transmit the corresponding response type.
3rd party STA may set its NAV or deferred channel access time according to the response type and whether it is NDP frame or normal frame
If a NDP frame is used, its duration is fixed
If a normal frame is used, the duration can be calculated based on the length and expected transmission rate (equivalent to the data transmission rate)
If unknown frame is used, the duration can be set as e.g. (aPPDUMaxTime+aSIFSTime)
3rd party STA may set its NAV (defer channel access) upon receiving Ack Indication in SIG:
If Ack Indication=00, it can start to contend the channel after the duration (aSIFSTime+NDP frame duration) following current transmission;
If Ack Indication=01, it can start to contend the channel after the duration (aSIFSTime+ACK duration (Option A) or the duration for frame size X (Option B)) following current transmission;
If Ack Indication=10, it can start to contend the channel when current transmission ends;
If Ack Indication=11, 3rd party STA may receive the next immediate frame following current transmission if it wants to set NAV or deferred channel access time accurately (but it can set to e.g. (aPPDUMaxTime+aSIFSTime) in Speed Frame Exchange.)

In the following, speed frame exchange using short Ack according to various embodiments will be described. According to various embodiments, an approach based on NDP frames for speed frame exchange may be provided. The current problem for speed frame exchange may be that NDP frames such as short Ack reloads 2-bit Ack Indication.

Figure 11:
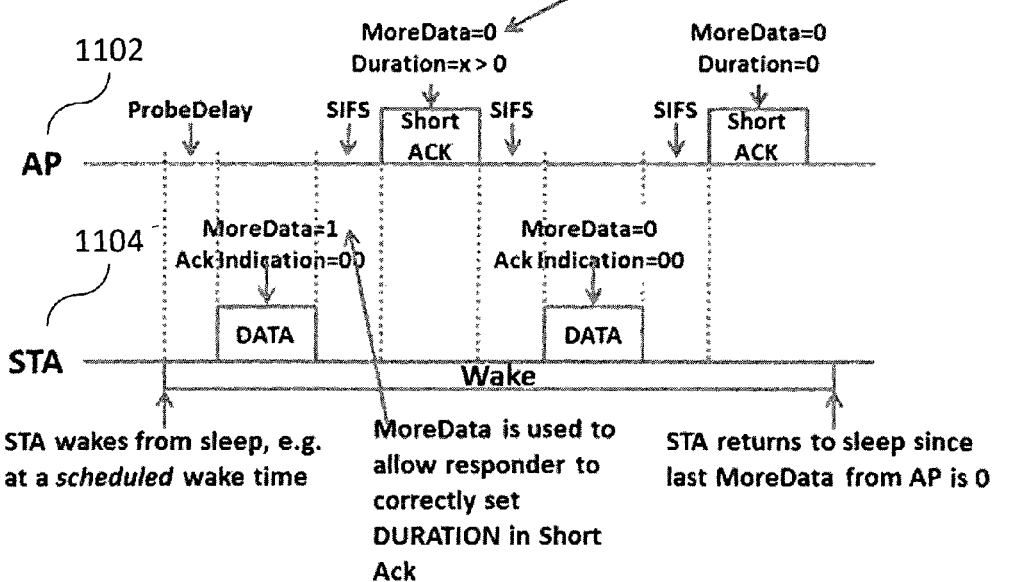
FIG. 11 shows an illustration of speed frame exchange using short Ack according to various embodiments.

FIG. 11 shows an illustration 1100 of speed frame exchange using short Ack according to various embodiments. Data processing 1102 of an access point (AP) and data processing 1104 of a station STA are shown.

According to various embodiments, as a first option, the duration field in Short Ack SIG may be set to indicate whether there will be data frame following current transmission:
Duration=0 indicates there will no data frame following current transmission;
Duration=x>0, e.g. aSIFSTime or (aPPDUMaxTime+aSIFSTime) (other value is also possible, as long as it makes clear that there will be some data frame following this Short Ack) indicates there will data frame following current transmission.

According to various embodiments, as a second option, if a duration field in Short Ack SIG (for NDP PS-Poll) is not defined or allowed to be used, one available bit (Immediate Response Frame Indication, IRFI) may be defined to indicate whether there will be data frame following current transmission.

According to various embodiments, as a third option, if both duration and IRFI fields are available, the following may be applied:
- IRFI=1 indicates there will be a following frame, Duration field=0 if the frame duration is unknown or Duration=the frame duration+aSIFSTime if the frame being acknowledged contains NAV information or deferred channel access time or the duration of the frame following Short Ack is known;
- IRFI=0 and Duration>0 indicates that short Ack is a timer/time indication;
- IRFI=0 and Duration=0 indicates that short Ack is not a timer/time indication.

According to various embodiments, as a fourth option, 2-bit Ack Indication may be defined (or may not be reloaded).

Uplink data indication or MoreData bit may be used indicate uplink buffered data and can be used as the first frame for speed frame change. According to various embodiments, uplink data indication or MoreData bit may be used to indicate whether there is uplink data in PS-Poll which can be used as the first frame for speed frame' change.

According to various embodiments, setting NAV or deferred channel access time to defer channel access may be provided as will be described in the following.

According to various embodiments: in the first option, if IRFI is not defined:
- 3rd party STA receiving short Ack with DURATION=x>0. 3rd party STA should defer channel access after at least a period of x before transmitting;
- If x=aSIFSTime, early indication design principle is not applied;
- If x=aPPDUMaxTime+aSIFSTime, early indication design principle is applied. The approach may be the same as using Ack Indication bits 0b11;
- The STAs involved in speed frame change will access the channel.

According to various embodiments, in the second option, if IRFI is defined, the duration field may not be used and the following may apply:
- IRFI=1 indicates there is an immediate following frame, same as 0b11;
- IRFI=0 indicates there is no immediate following frame, same as No Ack (b10).

According to various embodiments, in the third option, the following may apply:
- IRFI=1 and Duration field=0 indicates there is an immediate following frame, same as using Ack Indication bits 0b11;
- IRFI=1 and Duration field=X>0 indicates there will be a following frame with duration X-aSIFSTime;
- IRFI=0 indicates there is no immediate following frame, same as No Ack (b10).

According to various embodiments, in the fourth option, the duration field may not be required.

According to various embodiments, channel access upon receipt of short Ack may be provided as described in the following.

According to various embodiments, in the first option, a 3rd party STA may defer channel access after the period of time=(equal to) DURATION field value in Short Ack SIG upon receiving Short Ack.

According to various embodiments, in the second option, the 3rd party STA may defer channel access after aPPDU-MaxTime+aSIFSTime upon receiving Short Ack with IRFI=1, or start channel access immediately for the case of IRFI=0.

According to various embodiments, in the third option, the 3rd party STA may defer channel access after the period of time=(equal to) DURATION field value in Short Ack SIG upon receiving Short Ack with IRFI=1, or start channel access immediately for the case of IRFI=0.

According to various embodiments, in the fourth option, the same as that in speed frame exchange using normal ACK may be applied.

According to various embodiments, other NDP frame as the response frame may include the fields of More Data and IRFI. The procedure using this kind of NDP CTS may be similar to that for using short Ack.

In the following, enhancement to TXOP sharing for two-hop relay according to various embodiments will be described.

Figure 12:
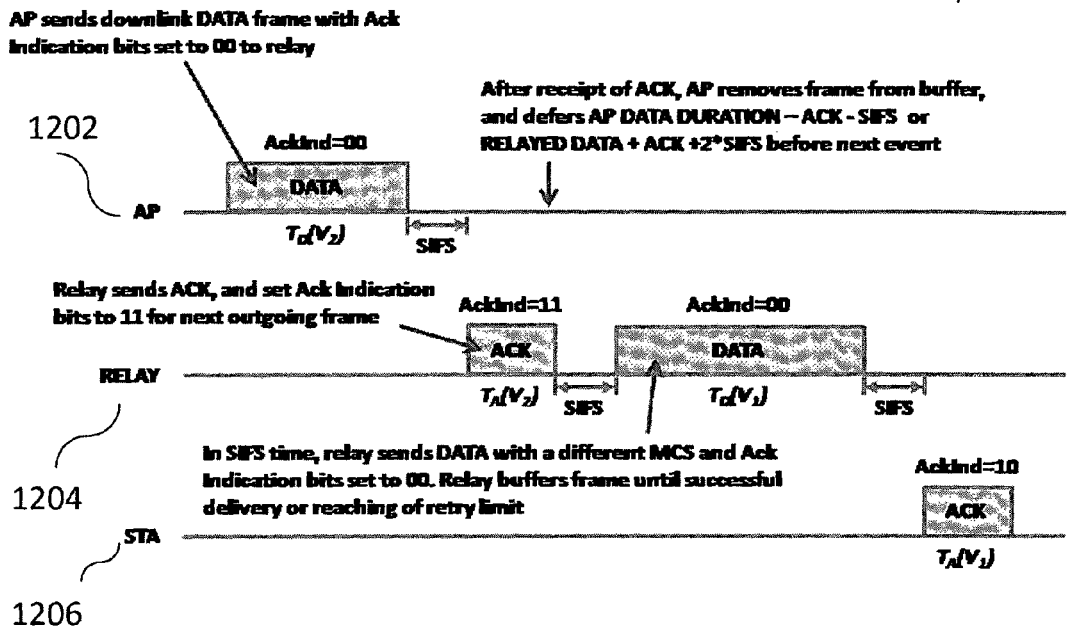
FIG. 12 shows an illustration of the Downlink TXOP sharing for two-hop Relay with Explicit ACK.

FIG. 12 shows an illustration 1200 of the Downlink TXOP sharing for two-hop Relay with Explicit ACK, where after AP transmits DATA to the RELAY and receipt of ACK from the RELAY, AP removes frame from buffer and defers some time X before next event. Processing 1202 of the AP, processing 1204 of the relay, and processing 1206 of the STA are illustrated. If X is set to MAX_PPDU+ACK+2*SIFS, the deferred time setting is not accurate as RELAY can calculate the correct duration to be included in ACK, even for DATA without Duration field (e.g. DATA with a short MAC header), for example based on the information in SIG field of DATA frame such as LENGTH/DURATION (which is the number of symbols when aggregation is 1, is in number of bytes when aggregation is 0, Mandate AMPDU for packet sizes >511 bytes and for MU). The Duration setting and/or deferred time to next event is subject to TXOP constraint (they can't go beyond TXOP limit).

When there is an upper limit of TXOP time, if the duration that is larger than this upper limit can be used as reserved cases as well. For the duration that is smaller than the smallest possible value (e.g. SIFS or SIFS+NDP ACK) can be used as reserved cases. Thus, the reserved cases of Duration field that are used for equivalent ACK Indication are indicated by the most or least significant bits of Duration field.

In another embodiment for equivalent ACK Indication, we can make use of the following reserved values to indicate equivalent ACK Indication for No Response and Long Response with unknown duration for early ACK indication. For example, Duration Indication=0 and Duration=0 indicates the equivalent ACK Indication of No Response and Duration Indication=1 and Duration=0 indicates the equivalent ACK Indication of Long Response with unknown duration.

In this case, the least significant bit of Duration is reserved for equivalent ACK Indication.

The reserved values that are smaller than or equal to floor (SIFS/TU) (where floor(x) is the floor function, indicating the largest integer not greater than x)) can be used to indicate other cases e.g. the following response frame is CTS (CTS-to-self). The reserved case may be extended to the duration that is smaller than (SIFS+NDP ACK)/TU, as the shortest frame length is NDP frame and SIFS is the shortest interframe space. For example of 1 MHz, if NDP frame is 6 OFDM symbols and each OFDM symbol is 40 microsecond, the shortest frame duration is 560 microsecond (taking into account the preamble which is 320 microsecond). Thus, if TU is 160 microseconds, we have four reserved cases 0, 1, 2 and 3. If (SIFS+NDP ACK)/TU is round up, we can have one more reserved value which is 4. In this case, the 2 least significant bit of Duration is reserved for equivalent ACK Indication when Duration Indication is set to 1.

In addition to the above embodiment for equivalent ACK Indication, we can also reverse the values of Duration field that are smaller than a minimum wakeup timer value and use them to indicate the equivalent ACK Indication. For example, if minimum wakeup timer is at least 2 with a time unit TU e.g. 1 millisecond, we can reserve the case of Duration=1 and Duration=1 as well to indicate e.g. the following immediate response frame is CF-End. In this case, the least significant bit of Duration is reserved for equivalent ACK Indication when Duration Indication is set to 1.

According to various embodiments, methods and devices may be provided wherein after AP transmits DATA to the RELAY and receipt of ACK (Duration field is set to X) from the RELAY, the AP removes frame from buffer and defers before next event a time of (X*TU−ACK−SIFS) where TU is time unit for Duration field of ACK and ACK indicates ACK frame duration time before next event. If NDP ACK/Modified ACK is used, the deferred time is the. Duration field value of the transmitted DATA−NDP ACK−SIFS. If DATA is a baseline (802.11-2012) frame format with Duration/ID field, the Duration field setting in AP for DATA frame is based on the data rate between AP and RELAY as well as RELAY and STA. X may also be set according to DATA transmission time between RELAY and STA for the relayed DATA frame+ACK+2*SIFS. The similar approach may be applied to NDP ACK/Modified ACK. This change may improve the accuracy of NAV setting or deferred channel access time for the STA. The unintended STA is able to set an accurate NAV or deferred channel access time so that it may be able to save the power further. The above method is also valid for uplink TXOP sharing for two-hop relay.

If DATA is without Duration field (e.g. DATA is with a short MAC header) but with LENGTH/DURATION in PHY SIG field, the LENGTH/DURATION in SIG field and data rate between RELAY and the intended receiver can be used to determine the Duration field value of ACK sent by RELAY. In downlink TXOP sharing for two-hop relay, after AP transmits DATA to the RELAY and receipt of ACK (Duration field is set to X) from the RELAY, AP removes frame from buffer and defers before next event for a time of (X*TU−ACK−SIFS) where TU is time unit for Duration field of ACK and ACK indicates ACK frame duration time. If NDP ACK/Modified ACK is used, the deferred time is the Duration field value of the transmitted DATA−NDP ACK−SIFS. The Duration field setting in RELAY for ACK is based on the data rate between RELAY and STA and the information on LENGTH/DURATION in PHY SIG fields. X should be set according to DATA transmission time between RELAY and STA for the relayed DATA frame+ACK+2*SIFS. The similar approach applies to NDP ACK/Modified ACK.

Figure 13:
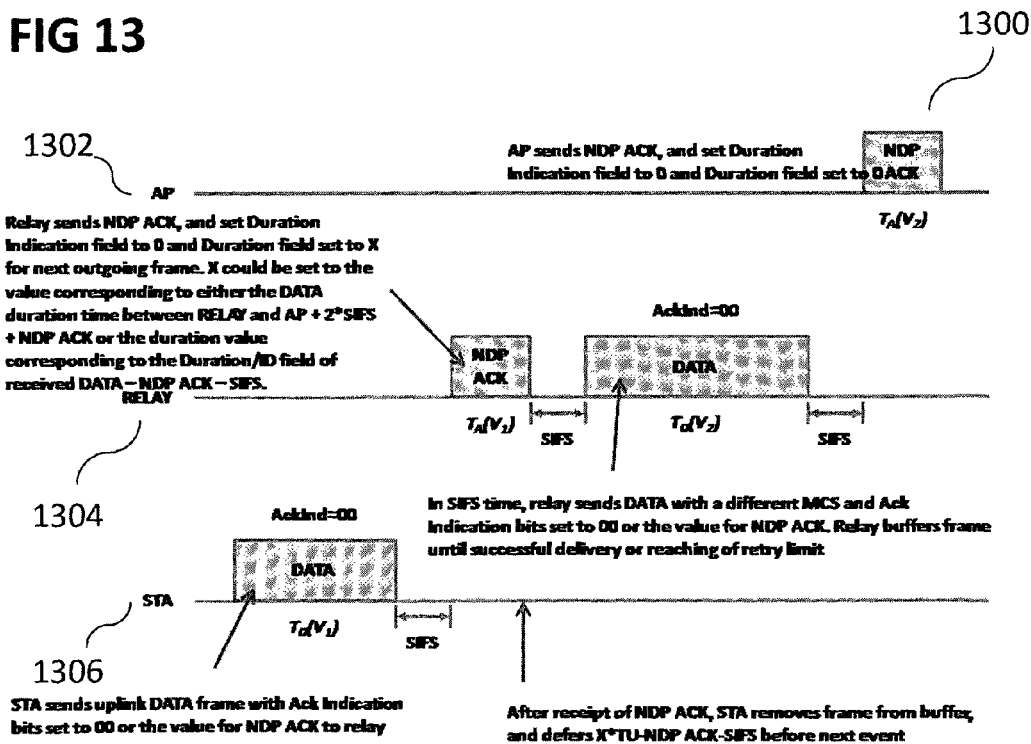
FIG. 13 shows an illustration of uplink TXOP sharing for two-hop relay using NDP ACK.

FIG. 13 shows an illustration 1300 of uplink TXOP sharing for two-hop relay using NDP ACK. Processing 1302 of the AP, processing 1304 of the relay, and processing 1306 of the STA are illustrated. According to various embodiments, NDP ACK/Modified ACK may be used in the TXOP sharing for two-hop relay procedure to further improve the efficiency. FIG. 13 illustrates an example of uplink TXOP sharing for two-hop relay with Explicit ACK using NDP ACK. The usage of Duration Indication and Duration fields for NDP ACK/modified ACK can be seen in Table 7. The NDP (Modified) ACK frame with the reserved value for the Duration field that is smaller than SIFS/TU can be used to indicate other NDP frames (e.g. when Duration Indication is set to 0). When SIFS is 160 millisecond and TU is 40 millisecond, there are 3 reserved values (1, 2, 3) that can be used to indicate other NDP frames. A NDP (Modified) ACK with the Duration Indication field set to 0 and the Duration field set to 1 can be used to indicate a null data packet of CF-End that is used to truncate the TXOP. In this case, ACK ID of this NDP frame can be computed as if the transmitter were the intended recipient. Alternatively, ACK ID of this NDP frame can be computed based on the partial AID (PAID) of the transmitter STA or the partial BSSID of the AP with which the transmitter STA is associated. The intended receiver should regard this special NDP frame as the truncation of the current TXOP. $3^{rd}$ party STA should regard this special NDP frame as a CF-End frame.

TABLE 7

Usage of Duration Indication and Duration fields in NDP ACK/Modified ACK

| Duration Indication | Duration | Description |
| --- | --- | --- |
| 0 | 0 | Ack Indication = 10 (No response), which means there will no response frame. |
| 0 | SIFS/TU | Ack Indication = 11 (long response, unknown length/duration), which means there will be a data frame with unknown duration as the long response. |
| 0 | >SIFS/TU (SIFS/TU may be round up/off. Other suitable value is also possible, as long as it is smaller than SIFS/TU and larger than 0) | Ack Indication = 11 (long response, known length/duration), which means there will be a data frame with known duration as the long response. |
| 1 | 0 | No sleep time |
| 1 | Nonzero | Wakeup timer |

In the following expressions for the duration, without causing ambiguity, we can denote the duration for the transmission of maximum size of PPDU i.e. aPPDUMaxTime by MAX_PPDU, the duration for the transmission of ACK frame by ACK and aSIFSTime by SIFS.

For speed frame exchange based on NDP ACK as described herein, since Duration field is available for NDP ACK/Modified ACK, we can (1) set Duration Indication field to 0 which means the Duration field is used for the duration for frame transmission and Duration field is used to indicate the channel access reservation time for the transmission following current NDP ACK/modified ACK, e.g. to indicate there will be an immediate frame following NDP ACK. If the frame duration is known from immediate previous frame, Duration field for NDP ACK is set to (the corresponding duration indicated in the immediate previous frame−NDP ACK−SIFS)/TU (TU is the time unit for Duration field when Duration Indication=0). If the frame duration is unknown, Duration field is set to SIFS/TU (i.e. an equivalent value based on Time Unit for Duration field) in NDP ACK/modified ACK. A Duration field value corresponding to the duration of SIFS (or a non-zero value smaller than SIFS) has a special meaning here. It is indicated that there will be an immediate following frame (SIFS after current NDP ACK/Modified ACK). To know the exact transmission, the unintended STA has to listen to the immediate next frame or defer channel access for NDP ACK+ 2*SIFS after receiving the frame that elicited the NDP ACK frame. A Duration field value of 0 means there is no immediate following frame. (2) Duration Indication field is set to 1 which means a wakeup timer and there is no immediate frame following current NDP ACK/Modified ACK, and Duration field is set to the sleep duration for the STA being acknowledged.

3rd party STA upon receiving Short Ack/modified short Ack:
  defers before next event for a duration=Duration field value in short Ack/modified short Ack * TU if Duration Indication=0 and Duration>SIFS/TU;
  defers before next event for a duration=aPPDUMaxTime+aSIFSTime if Duration Indication=0 and 0<Duration<=SIFS/TU; and
  defers SIFS before next event if Duration Indication=0 and Duration=0 or Duration Indication=1.

If Duration field (or Duration bits that can be unmasked from other fields in NDP ACK/Modified ACK) is available for short Ack/modified short Ack, we can let
  Duration Indication=0 indicates there could be an immediate frame following short Ack/modified short Ack
  o) Duration=0 is equivalent to No Response (equivalent to Ack Indication bits=10);
  o) Duration=SIFS/TU is equivalent to Long Response with unknown length/duration (equivalent to Ack Indication bits=11), suitable for DATA without Duration field; Long Response means the response data unit is a data frame;
  o) Duration>SIFS/TU is equivalent to long Response with known length/duration (Ack Indication bits=11) indicates channel access reservation time for the transmissions following current short Ack/modified short Ack, suitable for DATA with Duration field;
  Duration Indication=1 indicates that Duration field is a wakeup timer and there is no immediate frame following current short Ack/modified short Ack
  o) Duration=0.0 is equivalent to No sleep time;
  o) Duration>0 indicates a wakeup timer.

The reason why we can set Duration Indication to 0 and Duration to a value<=SIFS/TU to indicate the equivalent indication of Ack Indication bits set to 11 (long response with unknown duration) is that the STA is only allowed to access the channel after SIFS upon receiving the frame such as NDP ACK or ACK. Thus, any value smaller or equal to SIFS/TU is not meaningful to the receiving STA or not allowed in the baseline (IEEE 802.11-2012). We can reserve all these values to represent the special indication. For example, if SIFS=4*TU, any value of 1, 2, 3 and 4 can be used to indicate the equivalent indication of Ack Indication bits set to 11.

Table 7 shows the usage of Duration Indication and Duration fields for NDP ACK/Modified ACK, illustrating the equivalent indication of ACK Indication bits based on the Duration Indication and Duration fields of NDP ACK. The NDP (Modified) ACK frame with the reserved value for the Duration field that is smaller than SIFS/TU can be used to indicate other NDP frames (e.g. when Duration Indication is set to 0). When SIFS is 160 millisecond and TU is 40 millisecond, there are at least 3 reserved values (1, 2, 3) that can be used to indicate other NDP frames. For example, a NDP (Modified) ACK with the Duration Indication field set to 0 and the Duration field set to 1 can be used to indicate a null data packet of CF-End that is used to truncate the TXOP. In this case, ACK ID of this NDP frame can be computed as if the transmitter were the intended recipient. Alternatively, ACK ID of this NDP frame can be computed based on the partial AID (PAID) of the transmitter STA or the partial BSSID of the AP with which the transmitter STA is associated. The intended receiver should regard this special NDP frame as the truncation of the current TXOP. $3^{rd}$ party STA should regard this special NDP frame as a CF-End frame.

In the example shown in FIG. 13, the STA may send DATA with ACK Indications to 00 or the value for NDP ACK firstly to RELAY and receives from RELAY an NDP ACK where Duration Indication field is set to 0 (i.e. indicating Duration field is for the Duration for the frame transmission time), Duration field is set to X, i.e. the duration value corresponding to either the DATA duration time between RELAY and AP+2*SIFS+NDP ACK or the duration value corresponding to the Duration/ID field of received DATA−NDP ACK−SIFS. Upon receipt of NDP ACK, after SIFS the STA removes frame from buffer and defers X*TU−NDP ACK−SIFS before next event. Immediately after NDP ACK, RELAY sends DATA to a different MCS and ACK Indication bits to 00 or the value for NDP ACK. Relay buffers frame until successful delivery or reaching of retry limit. Upon receiving the DATA from RELAY, AP sends NDP ACK with Duration Indication field set to 0 (i.e. indicating Duration field is for the Duration for the frame transmission time), Duration field set to 0 (i.e. indicating no immediate following frame after NDP ACK, equivalent to ACK Indication bits set to 10 (no response)).

In the above uplink TXOP sharing for two-hop relay with Explicit ACK, RELAY may have the buffered frame to transmit or retransmit before STA sends DATA for it to relay to AP. Based on buffered frame status, RELAY may decide to respond to DATA by ACK with ACK Indication bits set to 10 (no response) or NDP ACK with Duration Indication set to 0 and Duration set to 0, which means no TXOP sharing for two-hop relay. Upon receipt of the above ACK or NDP ACK, AP may select other STAs in the earlier Relay discovery procedure as the RELAY candidates for the STA and send the unsolicited relay selection request to the STA. Once the STA picks the RELAY, the procedure could be similar to the path setup request for the current RELAY. In this situation, RELAY may send its frame other than DATA that was just received from STA. If RELAY wants to relay the DATA to AP immediately, it can follow the abovementioned steps in the previous paragraph and store its backoff state for its buffered frames before relaying the DATA from the STA. The approach is also valid for uplink TXOP sharing for two-hop relay with Implicit ACK and downlink TXOP sharing for two-hop relay with Explicit/Implicit ACK.

In the following, a relay protocol according to various embodiments will be described.

In the following, relay flow control according to various embodiments will be described.

To suspend frame transmissions to Relay, a Relay may send a unicast or broadcast Relay Flow Suspend action frame, and Suspend Duration>0.
  STAs may not transmit data frames to the STA addressed in the TA for the amount of time indicated in Suspend Duration field.
  STAs may resume normal procedure for data frame transmission when the Suspend Duration time has expired.

To restart frame transmissions to Relay, a Relay may send a unicast or broadcast Relay Flow Resume action frame.
  STAs may cancel the flow suspend time, and resume normal procedure for data frame transmissions to the STA addressed in the TA.
  The sending of Relay Flow Resume action frame by the Relay is optional, and may be used by the Relay to cancel an existing Suspend Duration.

In R.4.5.C of IEEE 802.11-1137-15-00ah-specification-framework-for-tgah, Mingyong Park, "IEEE 802.11ah Specification Framework" (which may be referred to as the "draft specification" herein), the draft specification may define a flow control mechanism at the relay.

To suspend frame transmissions to Relay, a Relay may send a unicast or broadcast Relay Flow Suspend action frame, and Suspend Duration>0:

STAs may not transmit data frames to the STA addressed in the TA for the amount of time indicated in Suspend Duration field;

STAs may resume normal procedure for data frame transmission when the Suspend Duration time has expired.

To restart frame transmissions to Relay, a Relay may send a unicast or broadcast Relay Flow Resume action frame:

STAs may cancel the flow suspend time, and resume normal procedure for data frame transmissions to the STA addressed in the TA;

The sending of Relay Flow Resume action frame by the Relay is optional, and may be used by the Relay to cancel an existing Suspend Duration.

The draft specification may define a 1-bit field in FC in one of the S1G control response frame which includes a time field for Relay flow control signaling.

When a Relay receives a valid frame, the Relay may respond with:

An Implicit ACK in next: hop transmission after SIFS, if Relay has received Relayed Frame bit set to 1;

An ACK after SIFS with Relayed Frame bit set to 1, and continue with next-hop DATA transmission after SIFS;

An ACK after SIFS with Relayed Frame bit set to 0, and does not continue to use the remaining TXOP.

A relay may set Relayed Frame bit to 1 only if it has received a More Data bit set to 0.

The above may be provided for relay flow control and TXOP sharing for two-hop Relay.

According to various embodiments, the Duration Indication and Duration field of NDP ACK issued by the Relay upon receiving the frame to be relayed may be redefined, i.e. Duration Indication=(equal to) 1 may indicate the Duration subfield value equal to a Suspend Duration in the response NDP ACK frame issued by the Relay. This definition implies that Duration for NAV setting is 0 or deferred channel access for the STA receiving the NDP ACK frame with a Suspend Duration indication.

To suspend frame transmissions to Relay, a Relay may send a unicast or broadcast NDP ACK, by setting Duration Indication to 1 to indicate a valid non-zero Suspend Duration that is indicated by the Duration field of NDP ACK, STAs shall not transmit data frames to the STA with the matching ACK ID for the amount of time indicated in Duration field of NDP ACK. STAs may resume normal procedure for data frame transmission when the amount of time as indicated in Duration field of NDP ACK has expired.

Figure 14:
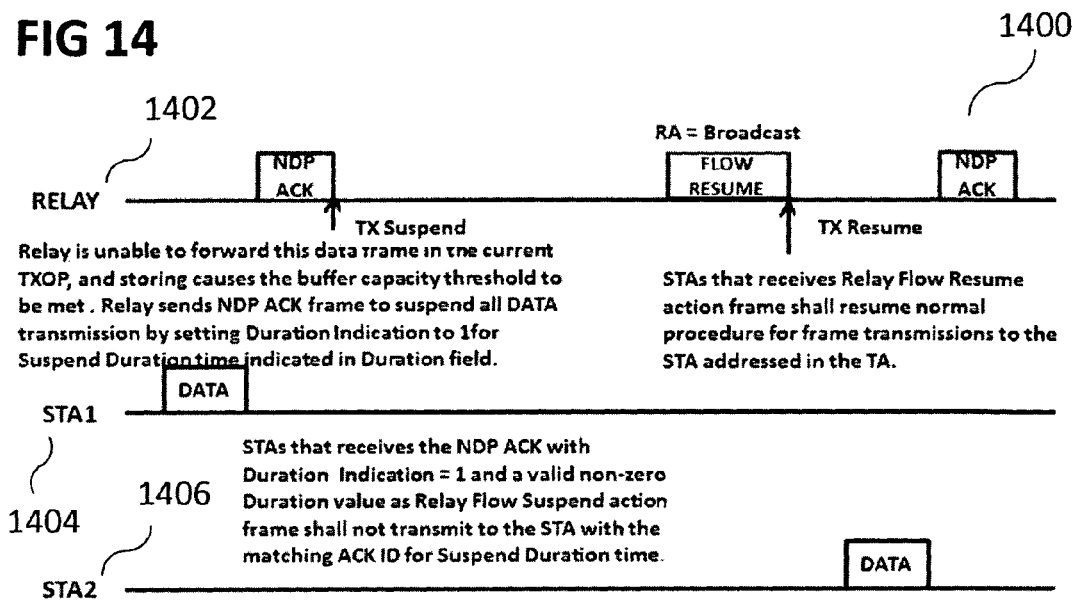
FIG. 14 shows an illustration of an example of the relay flow control indication according to various embodiments.

FIG. 14 shows an illustration 1400 of an example of the relay flow control indication according to various embodiments. Processing of a relay 1402, processing of a first station 1404 (STA1), and processing of a second station 1406 (STA2) are shown. As shown in FIG. 14, the STA1 with the data frames may stop the further transmission for a duration (as indicated in Duration field of NDP ACK) after receiving the response frame NDP ACK with Relayed Frame field set to 1 and Duration Indication set to 1, from the RELAY. The STA1 may resume the suspended transmission to the RELAY after the flow suspend duration expires and/or it received the FLOW RESUME frame from the RELAY.

To restart frame transmissions to Relay, a Relay may send a unicast or broadcast NDP ACK, by setting Duration Indication=0 to indicate a Resume Normal Procedure Action can be done, STAs may start to transmit data frames to the STA with the matching ACK ID.

According to various embodiments, an equivalent broadcast address for NDP ACK may be defined, for example ACK ID=all 1's or all 0's or a reserved case defined as broadcast address. ACK ID could be set to the value of partial BSSID for the broadcast, with other fields or an indication to indicate the NDP ACK is a broadcast frame.

If the ACK ID computation results are identical to the broadcast address for NDP ACK, there is an ambiguity on whether the responding NDP ACK frame is for the frame to be relayed.

The Relayed Frame field of NDP ACK may be set to 1 to differentiate the following two cases (Alternatively, the Relay may determine whether it is the recipient STA of the received frame by checking the information (e.g. Address 1 and/or Address 2) in the MAC header):

If the frame is sent to the Relay but not for relaying, Relayed Frame field of NDP ACK is set to 0. In this case, Duration Indication=1 and Duration=a valid non-zero value indicates a wakeup timer for the STA.

If the frame is sent to the Relay for relaying, Relayed Frame field of NDP ACK is set to 1. In this case, Duration Indication=(is equal to) 1 and Duration=(is equal to) a valid nonzero value indicates a Suspend Duration for the STA.

NDP ACK includes Duration Indication and Duration field. The usage of the Duration Indication and Duration fields of NDP ACK may be defined for the Relay flow control when Relayed Frame field of NDP ACK is set to 1: Duration Indication=1 indicates a Suspend Duration in the response NDP ACK frame by the Relay. To suspend frame transmissions to Relay, a Relay may send a NDP ACK, by setting both Relayed frame and Duration Indication fields to 1 to indicate a valid non-zero Suspend Duration that is indicated by the Duration field of NDP ACK, the STA may not transmit data frames to the Relay or the amount of time indicated in Duration field of NDP ACK. The STA may resume normal procedure for data frame transmission when the amount of time as indicated in Duration field of NDP ACK has expired.

A Relay AP may set both the Relayed Frame and Duration Indication fields to 1 and Duration field to a nonzero value equal to Flow Suspend duration in the response NDP ACK frame to request the STA that elicited the response to stop transmitting any data frames to the Relay AP. The Duration field of NDP ACK frame indicates the duration of time STAs are not permitted to transmit data frames to the Relay AP.

A STA that elicited the response receives an NDP ACK frame that has a matching ACK ID field and both the Relayed Frame and Duration Indication fields set to 1 shall not transmit any data frames to the AP for the amount of time indicated in the Duration field that is a nonzero value.

A STA may resume regular channel access procedure to transmit data frames addressed to the Relay AP after the expiration of the time indicated in the Duration field of NDP ACK frame.

Flow Control may be extended to a general case of data frame transmission between two STAs. Flow Control field may be included in NDP ACK frame. Upon receiving the data frame, the responding STA may set the both Flow Control and Duration Indication fields to 1 and the Duration subfield to a nonzero value equal- to Flow Suspend duration in the response frame NDP ACK to indicate the Flow Suspend duration such that the STA that elicited the response frame is not allowed to transmit to the responding STA. If Relayed Frame field is set to 1, the responding STA is a Relay; otherwise the responding STA is a non-Relay STA.

- An AP may set the Flow Control field to 1, the Duration Indication field to 1 and Duration field to a nonzero value equal to Flow Suspend duration in the response NDP ACK frame to request the STA that elicited the response to stop transmitting any data frames to the AP. The Duration field of NDP ACK frame indicates the duration of time STAs are not permitted to transmit data frames to the AP.
- A STA that elicited the response receives an NDP ACK frame that has a matching ACK ID field and both the Flow Control and Duration Indication fields set to 1 shall not transmit any data frames to the AP for the amount of time indicated in the Duration field that is a nonzero value.
- A STA may resume regular channel access procedure to transmit data frames addressed to the AP after the expiration of the time indicated in the Duration field of NDP ACK frame.

The alternative option to implement the flow control may be as follows:

Upon receiving the data frame, the responding STA may set the Duration Indication field to 1 and the Duration field to a reserved value for the indication of the response frame of being FLOW SUSPEND in the response frame NDP ACK to indicate the inactivity duration during which the STA that elicited the response frame is not allowed to transmit to responding STA. The FLOW SUSPEND frame is transmitted SIFS after receiving NDP ACK by the STA which elicited the response frame. An advantage of this embodiment is that the responding STA will send out the FLOW SUSPEND frame SIFS after it transmits NDP ACK. In this case, the responding STA is not required to contend the channel access DIFS and if necessary, some back-off time after transmitting the response frame, which reduces the waiting time of the STA which elicited the response frame. It is to be noted that the STA eliciting the response frame may go to sleep without receiving the flow control signaling if the responding STA does not indicate in the preceding frame exchange.

Figure 15:
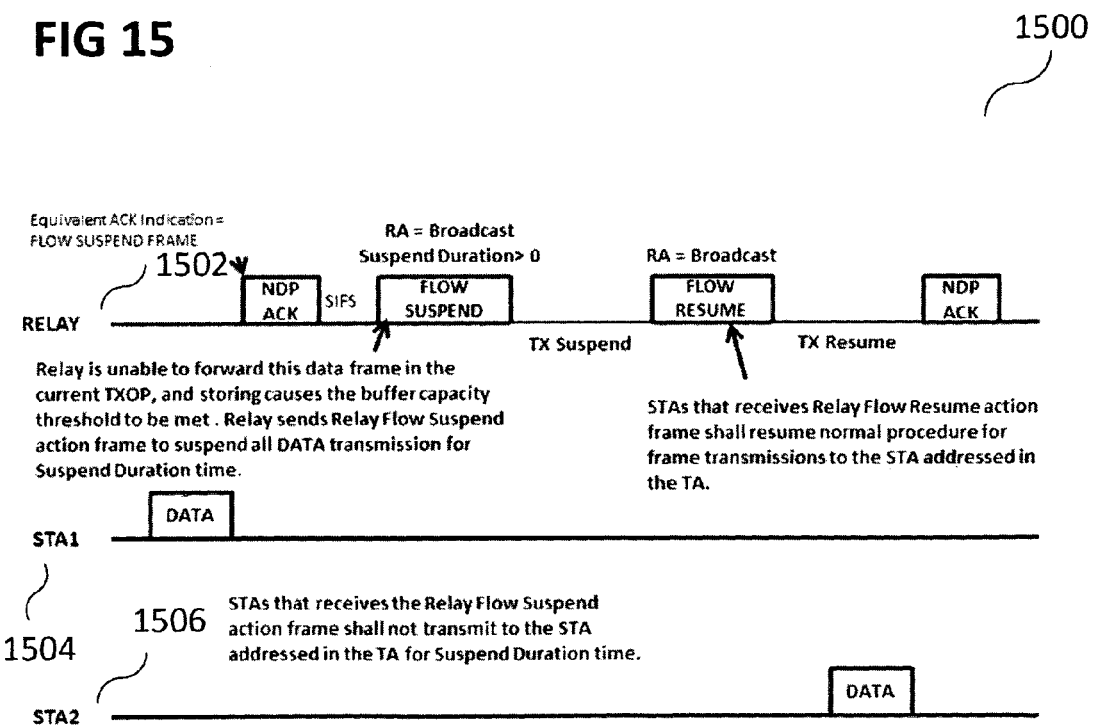
FIG. 15 shows an illustration of an example of an alternative option for relay flow control indication.

FIG. 15 shows an illustration 1500 of an example of an alternative option for relay flow control indication. Processing of a relay 1502, processing of a first station 1504 (STA1), and processing of a second station 1506 (STA2) are shown. In the example shown in FIG. 15, the STA1 eliciting the response frame may stop the further transmission for a duration equal to Suspend Duration (as indicated in FLOW SUSPEND frame) after receiving the FLOW SUSPEND frame from the RELAY. The FLOW SUSPEND frame may be transmitted by the RELAY SIFS (Short Interframe Spacing) after the reception of NDP ACK with equivalent ACK Indication equal to the FLOW SUSPEND frame (for example assuming that there are some reserved values that can be used for such equivalent ACK Indication. For example, we may use Duration Indication=0 and Duration=1 to indication the following response frame is FLOW SUSPEND frame). The STA1 may resume the suspended transmission to the RELAY after the flow suspend duration expires and it received the FLOW RESUME frame from the RELAY.

In the following, TXOP sharing for two-hop relay according to various embodiments will be described.

Figure 16:
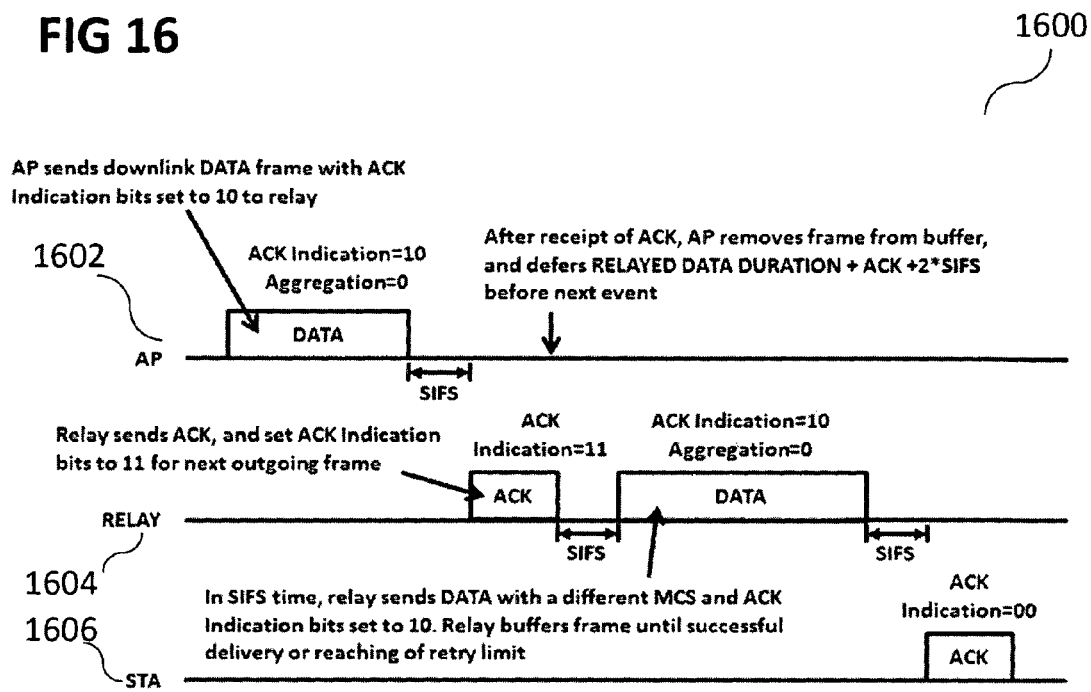
FIG. 16 shows an illustration of the Downlink TXOP sharing for two-hop Relay with Explicit ACK.

FIG. 16 shows an illustration 1600 of the Downlink TXOP sharing for two-hop Relay with Explicit ACK, wherein processing of an AP 1602, a RELAY 1604, and a STA 1606 are shown, and where after AP 1602 transmits DATA to the RELAY 1604 and receives ACK from the RELAY 1604, AP 1602 removes frame from buffer and defers some time X before next event or until a valid PHY–RXSTART.indication, whichever comes first. If X is set to MAX_PPDU+ACK+2*SIFS, the deferred time setting is not accurate as RELAY can calculate the correct duration to be included in ACK, even for DATA without Duration field (e.g. DATA with a short MAC header), simply based on the information in SIG field of DATA frame such as LENGTH/DURATION (which is the number of symbols when aggregation is 1, is in number of bytes when aggregation is 0, Mandate AMPDU for packet sizes>511 bytes and for MU). The Duration setting and/or deferred time to next event is subject to TXOP constraint (they can't go beyond TXOP limit).

According to various embodiments, devices and methods may be provided wherein after AP transmits DATA to the RELAY and receives ACK (Duration field is set to X) from the RELAY, AP removes frame from buffer and defers before next event a time of (X*TU−ACK−SIFS) where TU is time unit for Duration field of ACK and ACK indicates ACK frame duration time before next event, or until a valid PHY–RXSTART.indication, whichever comes first. If NDP ACK/NDP Modified ACK is used, the deferred time is the duration value equal to X*TU−NDP ACK−SIFS. If DATA is a baseline (802.11-2012) frame format with Duration/ID field, the Duration field setting in AP for DATA frame is based on the data rate between AP and RELAY as well as RELAY and STA. X can also be set according to DATA transmission time between RELAY and STA for the relayed DATA frame+ACK+2*SIFS for the case of using ACK. The similar approach applies to the case of using NDP ACK/NDP Modified ACK. This change may improve the accuracy of NAV setting or deferred channel access time for the STA. The unintended STA is able to set an accurate NAV or deferred channel access time so that it may be able to save the power further. The above method is also valid for uplink TXOP sharing for two-hop relay.

If DATA is without Duration field (e.g. DATA is with a short MAC header) but with LENGTH/DURATION in PHY SIG field, the LENGTH/DURATION in SIG field and data rate between RELAY and the intended receiver can be used to determine the Duration field value of ACK sent by RELAY. In downlink TXOP sharing for two-hop relay, after AP transmits DATA to the RELAY and receives ACK (Duration field is set to X) from the RELAY, AP removes frame from buffer and defers before next event for a time of (X*TU−ACK−SIFS) where TU is time unit for Duration field of ACK and ACK indicates ACK frame duration time, or until a valid PHY–RXSTART.indication, whichever comes first. If NDP ACK/NDP Modified ACK is used, the deferred time is the Duration field value of the transmitted DATA−NDP ACK−SIFS. The Duration field setting in RELAY for ACK is based on the data rate between RELAY and STA and the information on LENGTH/DURATION in PHY SIG fields. X should be set according to DATA transmission time between RELAY and STA for the relayed DATA frame+ACK+2*SIFS. The similar approach applies to NDP ACK/NDP Modified ACK.

Figure 17:
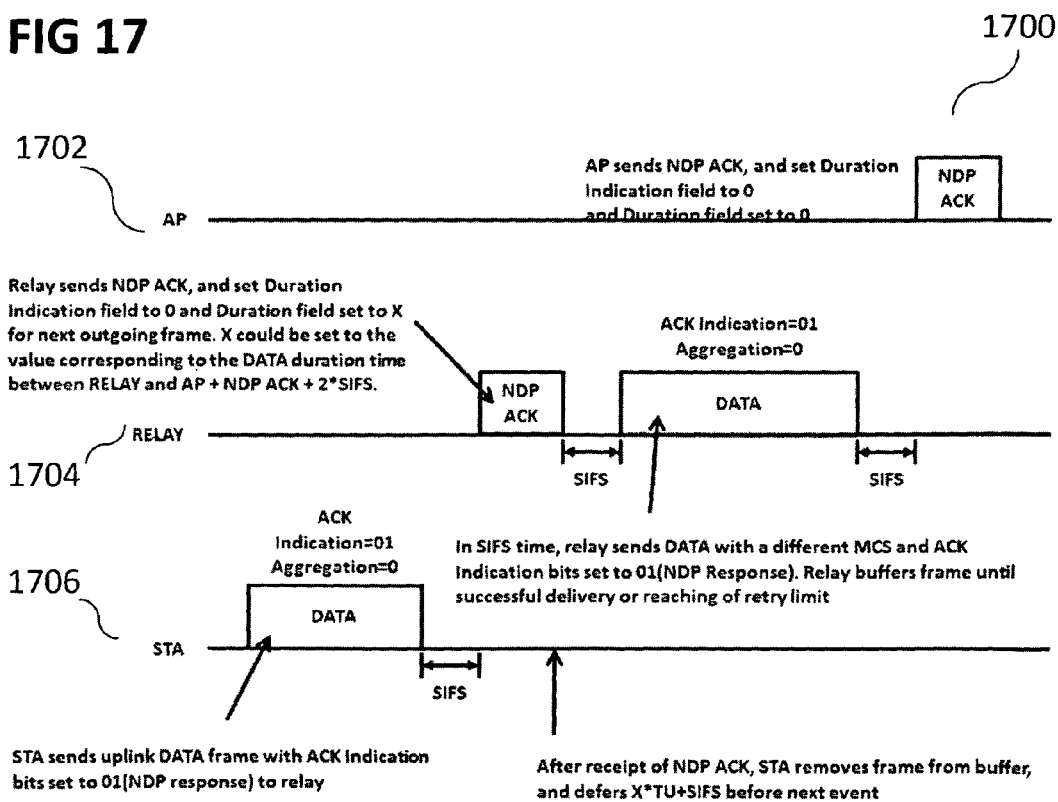
FIG. 17 shows an illustration of uplink TXOP sharing for two-hop Relay using NDP ACK according to various embodiments.

FIG. 17 shows an illustration 1700 of uplink TXOP sharing for two-hop Relay using NDP ACK according to various embodiments. Processing of an AP 1702, a RELAY 1704, and a STA 1706 are shown.

According to various embodiments, devices and methods may be provided which use NDK ACK/NDP Modified ACK in the TXOP sharing for two-hop relay procedure to further improve the efficiency. FIG. 17 illustrates an example of uplink TXOP sharing for two-hop relay with Explicit ACK using NDP ACK. The usage of Duration Indication and Duration fields for NDP ACK/NDP Modified ACK can be seen in Table 8.

TABLE 8

Duration Indication and Duration fields for Equivalent ACK Indication

| Duration Indication | Duration | Description |
|---|---|---|
| 0 | 0 | ACK Indication = No Response, which means there will be no response frame. |
| 1 | 0 | ACK Indication = Long Response, which means there will be a data frame as the long response. |

In the example shown in FIG. 17, the STA 1702 may send DATA with ACK Indication field value set to NDP Response firstly to RELAY and receives from RELAY an NDP ACK where Duration Indication field is set to 0 (i.e. indicating Duration field is for the Duration for the frame transmission time), Duration field is set to X, i.e. the duration value corresponding to either the DATA duration time between RELAY and AP+2*SIFS+NDP ACK or the duration value corresponding to the Duration/ID field of received DATA−NDP ACK−SIFS. It is to be noted that the duration of NDP ACK should consider the rounding effect as the Duration field of NDP ACK may have a larger time unit than data frame or other frame with Duration for NAV setting. Upon receipt of NDP ACK, after SIFS the STA 1706 may remove frame from buffer and defers X*TU−NDP ACK−SIFS before next event, or until a valid PHY−RXSTART.indication, whichever comes first. Immediately after NDP ACK, RELAY sends DATA with a different MCS and ACK Indication field set to NDP Response. Relay buffers frame until successful delivery or reaching of retry limit. Upon receiving the DATA from RELAY, AP sends NDP ACK with Duration Indication field set to 0 (i.e. indicating Duration field is for the Duration for the frame transmission time), Duration field set to 0 (i.e. indicating no immediate following frame after NDP ACK, equivalent to ACK Indication set to No Response). Table 8 shows the Duration Indication and Duration fields for Equivalent ACK Indication in NDP ACK/NDP Modified ACK.

In the example shown in FIG. 17, the STA 1702 may send DATA with ACK Indication field value set to NDP Response and Relayed Frame field set to 1 firstly to RELAY and receives from RELAY an NDP ACK where Duration Indication field is set to 1 and Duration field is set to 0 to indicate Long Response. Immediately after NDP ACK, RELAY sends to AP the DATA with ACK Indication field set to NDP Response.

In the example shown in FIG. 17, when the STA 1702 may send DATA with ACK Indication field value set to Long Response and Relayed Frame field set to 1 firstly to RELAY. SIFS after receiving DATA, RELAY may not respond with an NDP ACK and may forward to AP the received DATA frame with ACK Indication field set to NDP Response.

In the above procedure of TXOP sharing for two-hop Relay, the STA that transmitted the data frame for relaying elicited the response from the Relay may set its NAV or deferred channel access time and/or RID value properly.

For the case of frame transmission with Duration, the STA may set a correct RID value when ACK_INDICATION of the received frame is 3. For example shown in FIG. 16, when the AP receives the ACK from the Relay and also the SIG field of the relayed frame, it may derive the accurate NAV or deferred channel access time and/or RID value based on LENGTH and MCS subfield of SIG field of the received frame. Therefore, instead of using MAX_PPDU+ACK+ 2*SIFS for deferred time setting upon receipt of ACK with ACK Indication field equal to Long Response from the RELAY, AP may set the NAV based on the Duration field of ACK that is set to DATA transmission time between RELAY and STA for the relayed DATA frame+ACK+2*SIFS and reset the RID value to zero.

For example shown in FIG. 17, when the STA receives the NDP ACK from the Relay, it may derive the accurate NAV and/or RID value based on Duration subfield of the received NDP ACK frame. Therefore, instead of using MAX_PPDU+ NDP ACK+2*SIFS for deferred time setting upon receipt of NDP ACK with ACK Indication equal to Long Response from the RELAY, STA may set the NAV based on the Duration subfield of NDP ACK that is set to DATA transmission time between RELAY and AP for the relayed DATA frame+NDP ACK+2*SIFS and reset the RID value to zero.

Therefore, the Duration for NAV setting and NAV and RID update rule in TXOP sharing for two-hop relay is as follows:

In response to the relayed frame, the relay STA may set Duration to the transmission time between the relay and the next hop STA for the relayed frame that elicited the response.

The STA that elicited the response from the relay may set the NAV based on the Duration field of the response frame+the response (NDP ACK or ACK)+2*SIFS and reset the RID value to zero.

Whether to proceed with TXOP sharing for two-hop relaying, we may setup the following rule:

When AP is busy in transmission or other operation (NAV counter is nonzero), the Relay is not able to forward to the AP the frame received from the non-AP STA if the Relay has its nonzero NAV counter. Similarly, when a non-AP STA is busy in transmission or other operation (NAV counter is nonzero), the Relay is not able to forward to the non-AP STA the frame received from the AP if the Relay has its nonzero NAV counter. In this situation, the Relay may respond with (NDP) ACK, with equivalent ACK INDICATION value or ACK_INDICATION set to No Response to stop TXOP sharing for two-hop relaying. The Relay shall not update its NAV counter when it receives the frame for TXOP sharing for two-hop relaying.

Another embodiment may be as follows:

A non-AP STA starts a frame exchange by sending a Short Data frame addressed to the relay STA with TXVECTOR parameter ACK_INDICATION (assume that the TXVECTOR parameter ACK_INDICATION is the defined parameter that is used to indicate the response frame) set to NDP Response. The relay STA may set the Duration Indication field to 1 and Duration field to 0 in the NDP ACK frame that is transmitted to the non-AP STA to indicate Long Response. In addition it shall set the Relayed Frame field of the NDP ACK frame to 1.

When the direction of the frame is from the AP to the non-AP STA, the AP starts a frame exchange by sending a Short Data frame addressed to the relay STA with the TXVECTOR parameter ACK_INDICATION set to NDP Response. The relay STA shall set the Duration Indication field to 1 and the Duration field to 0 in the NDP ACK frame that is transmitted to the AP to indicate Long Response. In addition it may set the Relayed Frame field of the NDP ACK frame to 1.

In the following, ACK indication and NAV setting for speed frame exchange and TXOP will be described.

After a successful reception of a frame requiring acknowledgment, transmission of the (NDP) ACK frame shall commence after a SIFS, without regard to the busy/idle state of the medium. However, whether or not to continue the speed frame exchange may be based on the NAV setting in the STA.

For whether to proceed with speed frame exchange, we may setup the following rule:

If the responding STA receives a frame (e.g. short data frame without Duration field in MAC header) from its peer STA in speed frame exchange with ACK_ INDICATION set to 3 (i.e. Long Response) in RXVECTOR parameter, if NAV counter is nonzero due to the other reception that it has received at the earlier time, the responding STA shall not transmit a data frame as the response frame (i.e. Long Response). Instead, the responding STA may transmit an NDP ACK with an (equivalent) ACK INDICATION value equal to 0 (No Response) or transmit an ACK with ACK_INDICATION field set to 0 (No Response) to stop further frame exchange. The responding STA may not update its NAV counter upon receiving the frame for speed frame exchange.

In the following, NAV and equivalent ACK Indication setting for Speed frame exchange (SF) will be described.

If NDP ACK is used as the immediate response frame by the responding STA for the preceding frame that elicited the response in SF, when the preceding frame has More Data set to 0 and ACK Indication set to NDP response, if NDP ACK has More Data set to 1 (i.e. the responding STA has buffered frame to the STA that elicited the response), the responding STA shall set equivalent ACK Indication to Long Response in the immediate response NDP ACK frame;

when the preceding frame has More Data set to 0 and ACK Indication set to NDP response, if NDP ACK has More Data set to 0 (i.e. the responding STA has no buffered frame to the STA that elicited the response), the responding STA shall set equivalent ACK Indication to No Response in the immediate response NDP ACK frame.

In the following, SF (speed frame) using NDP frames (1 MHz) will be described.

When 1 MHz NDP PS-Poll is used, as there is no Duration field in 1 MHz NDP PS-Poll, there may be the question what ACK Indication field value shall the response frame set. It may be dependent on whether the response frame is DATA or NDP–Modified ACK.

If UDI is set to 0 or 1 in NDP PS-Poll, when the response frame is DATA, ACK Indication field value may be set to any value. If UDI=0, ACK Indication=1 (NDP ACK) or 2 (ACK). If UDI=1, ACK Indication is set to 3 (Long Response). Duration field of DATA can be set to SIFS+NDP ACK (1 MHz). The duration of NDP ACK should consider the rounding effect.

For SF,

1. If UDI is set to 1 in NDP PS-Poll, when the response frame is NDP Modified ACK, a reserved value equivalent to ACK Indication=Long Response shall be set. If the duration for UL transmission can be predicted, AP may set the Duration field for NAV setting.

2. If UDI is set to 0 in NDP PS-Poll, when the response frame is NDP Modified ACK, a value equivalent to ACK Indication=No Response shall be set if there is no buffered frame delivery to the STA from an AP (More Data is set to 0 in NDP Modified ACK).

3. If UDI is set to 0 in NDP PS-Poll, when the response frame is NDP Modified ACK, a reserved value equivalent to ACK Indication=Long Response (e.g. Duration Indication=1 and Duration=0) shall be set if there is buffered frame delivery to the STA from an AP (More Data is set to 1 in NDP Modified ACK). However, a better method for NDP ACK frame is that Duration Indication shall be set to 0 and Duration shall be set to the value for NAV setting that covers the transmission of buffered frame delivery to the STA, i.e. buffered frame duration+SIFS.

However, if there is no speed frame exchange,

1. If UDI is set to 1 in NDP PS-Poll, when the response frame is NDP Modified ACK, a reserved value equivalent to ACK Indication=No Response shall be set if there is no buffered frame delivery to the STA from an AP (More Data is set to 0 in NDP Modified ACK). For RAW operation, the frame of NDP PS-Poll and NDP Modified ACK is finished within a small slot duration that does not allow the transmission of uplink data from STA to its AP. The uplink frame is scheduled in a different RAW that allows a larger slot duration.

2. If UDI is set to 0 in NDP PS-Poll, when the response frame is NDP Modified ACK, a reserved value equivalent to ACK Indication=No Response (e.g. Duration Indication=0 and Duration=0) shall be set if there is buffered frame delivery to the STA from an AP (More Data is set to 1 in NDP Modified ACK). The STA either shall keep awake if the buffered frame from AP will be delivered soon or can go to sleep if the buffered frame from AP will be delivered at a different schedule time that is known to the STA (e.g. the STA is aware of the RAW operation indicated in RPS IE and can identify its downlink data delivery).

In the following, SF using NDP frames (>=2 MHz) will be described.

When >=2 MHz NDP PS-Poll is used, as there is UDI with Duration value in NDP PS-Poll, what ACK Indication field value shall the response frame set? It is dependent on whether the response frame is DATA or NDP Modified ACK.

When UDI is a nonzero positive value, if the response frame is DATA, ACK Indication field value shall be set to 3 (Long Response) though the uplink data is known. If More Data field in DATA frame is set to 0, Duration field of DATA can be set to either UDI value (converted to the corresponding time unit)+SIFS or 0. If More Data field in DATA frame is set to 1, Duration field of DATA can be set to UDI value (converted to the corresponding time unit)+SIFS or Downlink data duration for next frame+UDI value (converted to the corresponding time unit)+2*SIFS.

If the response frame is NDP Modified ACK, a reserved value equivalent to ACK Indication=Long Response with known duration shall be set, e.g. Duration Indication=0 and Duration=UDI value (converted to the corresponding time unit)+SIFS or Downlink data duration+UDI value (converted to the corresponding time unit)+2*SIFS, since the uplink data duration is given by UDI field value of NDP PS-Poll.

For SF,

1. If UDI is set to a nonzero positive value in NDP PS-Poll, when the response frame is NDP Modified ACK, if UDI is a Duration value for NAV setting, Duration Indication is set to 0 and Duration is set to UDI value (converted to the corresponding time unit)+SIFS if there is no buffered frame delivery to the STA from an AP (More Data is set to 0 in NDP Modified ACK), or Downlink data duration+UDI value (the corresponding time unit)+2*SIFS if there is buffered frame delivery to the STA from an AP (More Data is set to 1 in NDP Modified ACK). Otherwise, if UDI is not a Duration value for NAV setting, Duration Indication is set to 1 and Duration is set to 0 (equivalent ACK Indication=Long Response) regardless of whether there is buffered frame delivery to the STA from an AP. If the duration for UL transmission can be predicted, AP may set the Duration field for NAV setting.

2. If UDI is set to 0 in NDP PS-Poll, when the response frame is NDP Modified ACK, a value equivalent to ACK Indication=No Response shall be set if there is no buffered frame delivery to the STA from an AP (More Data is set to 0 in NDP Modified ACK).

3. If UDI is set to 0 in NDP PS-Poll, when the response frame is NDP Modified ACK, Duration Indication is set to 0 and Duration is set to Downlink data duration+SIFS if there is buffered frame delivery to the STA from an AP (More Data is set to 1 in NDP Modified ACK).

However, if there is no speed frame exchange,

1. If UDI is set to a nonzero positive value in NDP PS-Poll, when the response frame is NDP Modified ACK, a reserved value equivalent to ACK Indication=No Response shall be set if there is no buffered frame delivery to the STA from an AP (More Data is set to 0 in NDP Modified ACK). For RAW operation, the frame of NDP PS-Poll and NDP Modified ACK is finished within a small slot duration that does not allow the transmission of uplink data from STA to its AP. The uplink frame is scheduled in a different RAW that allows a larger slot duration.

2. If UDI is set to 0 in NDP PS-Poll, when the response frame is NDP Modified ACK, a reserved value equivalent to ACK Indication=No Response (e.g. Duration Indication=0 and Duration=0) shall be set if there is buffered frame delivery to the STA from an AP (More Data is set to 1 in NDP Modified ACK). The STA either shall keep awake if the buffered frame from AP will be delivered soon or can go to sleep if the buffered frame from AP will be delivered at a different schedule time that is known to the STA (e.g. the STA is aware of the RAW operation indicated in RPS IE and can identify its downlink data delivery).

Figure 18:
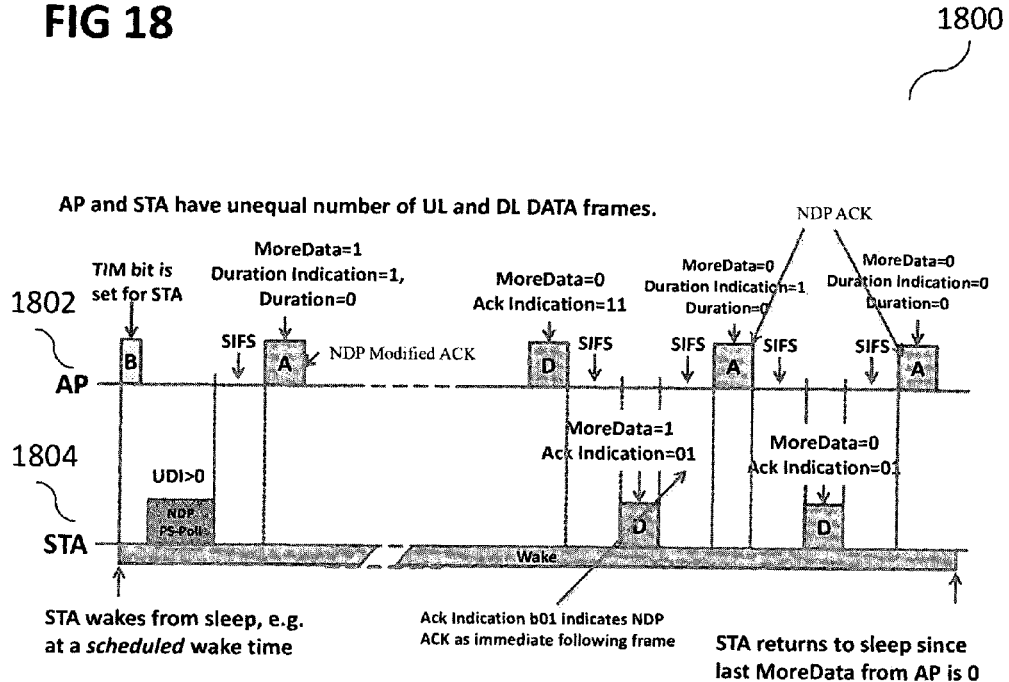
FIG. 18 shows an illustration of an example of speed frame exchange using NDP PS-Poll and NDP Modified ACK.

FIG. 18 shows an illustration 1800 of an example of speed frame exchange using NDP frames (i.e. NDP PS-Poll, NDP ACK and/or NDP Modified ACK) based on Table 8. Data processing 1802 of an access point (AP) and data processing 1804 of a station STA are shown. The station (non-AP STA or simply STA) may have uplink data to transmit to AP. Firstly, STA sends its NDP PS-Poll with UDI field in SIG set to 1 to indicate that it has buffered frame for the AP. Therefore the NDP Modified ACK frame is sent by the AP SIFS time after the reception of NDP PS-Poll, with the Duration Indication field set to 1 and the Duration field set to 0 to indicate Long Response. Upon receiving the NDP Modified ACK frame, the STA can transmit the buffered frame to the AP. After some frame exchange, when the AP sends Data frame with ACK_INDICATION (which is a TXVECTOR parameter or a field in the SIG field to indicate the response frame) set to 11 (indicating a data frame as the long response) and More Data set to 0, the STA shall send Data frame with ACK_INDICATION set to 01 (indicating a NDP ACK frame as the response) and More Data set to 1 as it still has a buffered frame for the AP. When there is no more buffered frame for the STA at the AP, AP transmits an NDP ACK frame with the Duration Indication field set to 1 and the Duration field set to 0 to indicate Long Response. Once the STA sends its last Data frame with ACK_INDICATION set to 01 and More Data set to 0, the AP shall respond with an NDP ACK frame with the Duration Indication field set to 1 and the Duration field set to 0 to indicate No Response.

Speed frame (SF) exchange allows an AP and non-AP STA to exchange a sequence of uplink and downlink PPDUs separated by SIFS. This operation combines both uplink and downlink channel access into a continuous frame exchange sequence between a pair of STAs. The objective of this operation is to minimize the number of contention-based channel accesses, improve channel efficiency by reducing the number of frame exchanges, and reduce STA power consumption by shortening Awake times.

One of the various embodiments for the rule of speed frame exchange will be described in the following.

An AP may send any frame as the initial frame of a SF exchange. An AP may set the ACK Indication field of the PLCP Signal field to Normal Response or NDP Response for the initial frame of a SF exchange.

A non-AP STA may send a trigger frame or a (NDP) PS-Poll frame as the initial frame of a SF exchange. A non-AP STA shall set the ACK Indication field of the PLCP Signalfield to Long Response in a frame that initiates an SF exchange if the initial frame is not a NDP PS-Poll frame.

A STA sending an immediate response that is not an NDP frame to a frame that had the More Data field set to 1 shall set the ACK Indication field to Long Response. A STA sending an immediate response NDP (Modified) ACK frame to a frame that had the More Data field set to 1 shall set the Duration Indication field to 1 and Duration field to 0 to indicate Long Response or set the Duration field for NAV setting for a SF exchange.

A non-AP STA sending an immediate response that, is an ACK frame or a BlockAck frame after receiving a frame that had the More Data field set to 0 shall set the ACK Indication field to No Response. A non-AP STA sending an immediate response NDP ACK frame after receiving a frame that had the More Data field set to 0 shall set the Duration Indication and Duration fields to 0 to indicate No Response.

An AP sending an immediate response that is an ACK frame or a BlockAck frame after receiving a frame that had the More Data field set to 0 shall set the ACK Indication field to Long Response if it will send a data frame SIFS time after the end of the immediate response transmission or No Response if it will not send a data frame SIFS time after the end of immediate response transmission. An AP sending an immediate response that is either an NDP ACK after receiving a frame that had the More Data field set to 0 or an NDP Modified ACK after receiving an NDP PS-Poll that had UDI field se to 0 shall set the Duration Indication and Duration fields to 0 to indicate No Response if it will not send a data frame SIFS time after the end of the NDP (Modified) ACK frame transmission, or the Duration Indication field to 1 and Duration field to 0 to indicate Long Response if it will send a data frame SIFS time after the end of the NDP (Modified) ACK frame transmission (1 MHz).

A STA that receives a frame with a unicast MAC address in the Address 1 field that matches its MAC address, or a unicast AID in the Address 1 field matching to its AID and a unicast MAC address in Address 2 field matching its AP's BSSID, or a NDP (Modified) ACK frame with a matching ACK ID within SIFS after the transmission of a frame accepts the reception as an acknowledgement for the its immediately previous transmission.

A STA sending an immediate response that is not an NDP (Modified) ACK and has the More Data field set to 1 and the ACK Indication field set to Long Response shall transmit a frame to the STA that elicited the response, SIFS after the transmission of the response frame if the More Data field was set to 0 in the frame most recently received from the STA, and set the Duration field to an estimated time to protect the remaining transmissions if there is a Duration field in the response frame.

A STA sending an immediate response that is an NDP ACK frame and had the More Data field set to 1 shall transmit a frame to the STA that elicited the response, SIFS after the transmission of the response frame in which the Duration Indication field shall be set to 0 and the Duration field shall be set to an estimated time to protect the remaining transmissions if the More Data field was set to 0 in the frame most recently received from the STA in a SF exchange.

An AP sending an immediate response that is an NDP Modified ACK frame and has the More Data field set to 1 shall transmit a frame to the STA that elicited the response, SIFS after the transmission of the response frame in which the Duration Indication field shall be set to 0 and the Duration field shall be set to an estimated time to protect the remaining transmissions if the UDI field was set to 0 in the NDP PS-Poll frame (>=2 MHz) most recently received from the non-AP STA in a SF exchange.

A STA sending an immediate response that is not an NDP (Modified) ACK and had the More Data field set to 1 and the ACK Indication field set Long Response shall not transmit a frame to the STA that elicited the response, SIFS after the transmission of the response frame in which the Duration field shall be set to a value equal to the time that is set by the Duration field in the frame that elicited the response, minus aSFISTime and a duration for the response frame transmission if there is a Duration field in both the response frame and the frame that elicited the response, or if there is a Duration field in the response frame and there is a NAV setting in the beginning of TXOP, if the More Data field was set to 1 in the data frame most recently received from the STA in a SF exchange.

A STA sending an immediate response that is an NDP ACK frame shall not transmit a frame to the STA that elicited the response, SIFS after the transmission of the response frame in which the Duration Indication field shall be set to 0 and the Duration field shall be set to a value equal to the time that is set by the Duration field in the frame that elicited the response, minus aSFISTime and a duration for the response NDP ACK frame transmission if there is a Duration field in the frame that elicited the response or if there is NAV setting in the beginning of TXOP, if the More Data field was set to 1 in the data frame most recently received from the STA in a SF exchange.

An AP sending an immediate response NDP Modified ACK frame shall not transmit a frame to the STA that elicited the response, SIFS after the transmission of the response frame in which the Duration Indication field shall be set to 1 and the Duration field shall be set to 0 to indicated Long Response, if the UDI field was set to a nonzero value in the NDP PS-Poll frame most recently received from the non-AP STA in a SF exchange.

Without the setup of Block Ack, a STA shall not use (NDP) BA for a SF exchange. With the set up of Block Ack, in response to the received frame with the More Data field set to 0 from the other STA that elicited the response in a SF exchange, a STA sending an immediate response that is not an NDP (Modified) ACK and had the More Data field set to 1 and the ACK Indication field set to Long Response shall continue to transmit its frames, until the last frame with the More Data field set to 0 and the ACK Indication field set to either Normal Response to request a (NDP) BA frame or NDP Response to NDP Response to request a NDP ACK frame, SIFS time after each transmission of the response frame in which the Duration field shall be set to a value equal to the time that is set by the Duration field in the frame that elicited the response, minus aSFISTime and a duration for the response frame transmission if there is a Duration field in both the response frame and the frame that elicited the response, or if there is a Duration field in the response frame and there is a NAV setting in the beginning of TXOP.

A STA sending an immediate response with the More Data field set to 1 and the TXVECTOR parameter ACK_INDICATION set to No Response shall transmit a frame to the STA that elicited the response within the current TXOP, but not SIFS after the transmission of the response frame.

A STA either sending an immediate response that sets the More Data field 0 and the TXVECTOR parameter ACK_INDICATION set to No Response shall not transmit a frame within the current TXOP to the STA that elicited the response.

A non-AP STA shall remain in the Awake state until the end of the current TXOP if it receives a frame with the More Data field set to 1 from either the AP addressed to itself or a NDP ACK (Modified) frame with a matching ACK ID.

A non-AP STA may transition to the Doze state if it receives a frame with the More Data field set to 0 either from the AP addressed to itself or in a NDP (Modified) ACK frame with a matching ACK ID.

In a TXOP, in order to disallow the peer STA (e.g. B) sending data frame as the long response, a STA (e.g. A) may send its data frame with ACK_INDICATION set to NDP frame (or Normal Response) to solicit a NDP ACK (Normal ACK) as the response frame for its transmitted, data frame. Even if STA B responds with a NDP ACK frame with the More Data field set to 1 to indicate that it has buffered frame for STA A, STA A may send its data frame with ACK_INDICATION set to NDP frame (or Normal Response) to continue to solicit a NDP ACK (or Normal ACK) frame instead of a data frame as the long response from STA B. This means the More Data field in the response frame transmitted by STA B is ignored by the TXOP holder/initiator (STA A). In this case, STA A continues to transmit its data frames without allowing the transmission of data frame from STA B as the response frame in the speed frame exchange.

When there are multiple frame transmissions for speed frame exchange in a TXOP that is limited by a value, the speed frame exchange may be stopped in order to limit the transmission within the TXOP limit. For example, when a data frame is requested as the long response frame, the responding STA may ignore the ACK INDICATION setting in the received frame that elicited the response, and transmit a shorter response such as NDP ACK. In this NDP ACK frame, Duration Indication field is set to 0 and Duration field is set to 0, indicating there will no more frame transmission within this TXOP.

Figure 19:
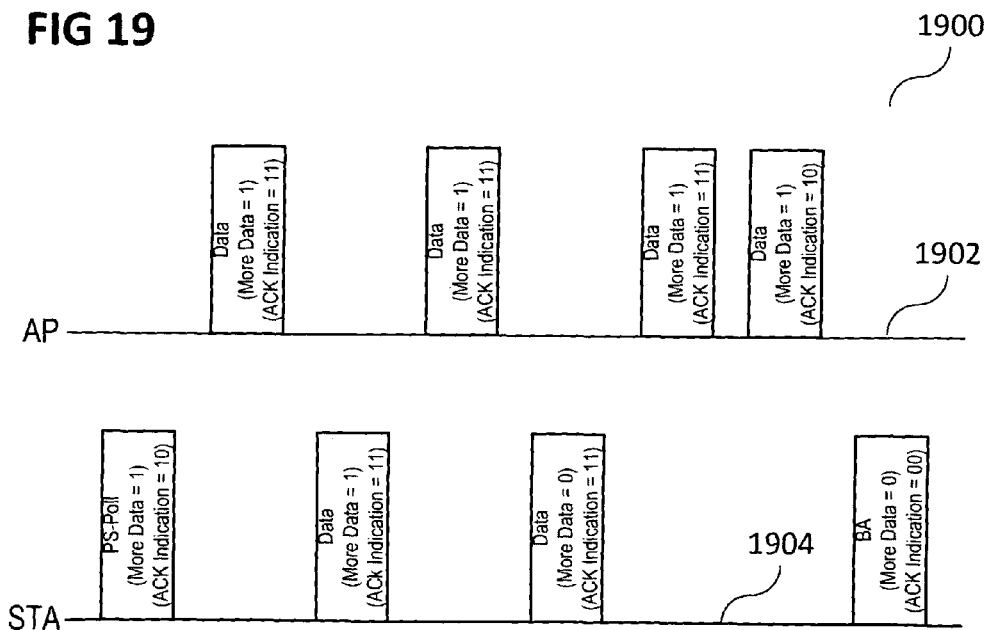
FIG. 19 shows an illustration of an example of speed frame exchange using normal frames.

FIG. 19 shows an illustration 1900 of an example of speed frame exchange using normal frames (i.e. ACK, BA and Data). Data processing 1902 of an access point (AP) and data processing 1904 of a station STA are shown. The station (non-AP STA or simply STA) may have uplink data to transmit to AP. Firstly, STA sends its PS-Poll with the ACK_INDICATION field in SIG set to 11 and the More Data field in Frame Control field set to 1 to indicate that it has buffered frame for the AP. AP responds with Data frame with the ACK_INDICATION field in SIG set to 11 and the More Data field in Frame Control field set to 1 to indicate that it has buffered frame for the STA. After some frame exchange, the STA has no more data buffered for the AP and sends a Data frame with the ACK_INDICATION field in SIG set to 11 and the More Data field in Frame Control field set to 0. From then on, AP responds with the Data frame with the ACK_INDICATION field in SIG set to 11, which tells the STA that the AP will continue the frame transmissions without any acknowledgement from the STA. Once there is no more buffered frame for the STA, the AP sends the Data frame with the ACK_INDICATION field in SIG set to 10, which tells the STA to send an immediate BA frame.

In the following, duration and NAV setting for TXOP will be described.

Duration/NAV setting for the normal frame in current 802.11 with Duration field still can follow the convention.

When RTS/CTS or other protection mechanism for channel access protects a TXOP, even if TXOP holder transmits the frame with a short MAC header that has no Duration field for NAV setting, the TXOP responder can still set the Duration field in the response frame (e.g. NDP ACK) after receiving the frame because the MCS and LENGTH (number of the OFDM symbols or number of bytes, dependent on Aggregation bit in SIG field) in the SIG field of the frame can be used to determine the value of Duration field in the response frame.

If the remaining NAV before the transmission of the frame is X and the duration for the frame is Y, the Duration field should be set as ceil((X−SIFS−Y)/TU), where TU is the time unit for Duration field when Duration Indication is 0 and ceil(x) is the ceiling function of x that is used to round up for the setting of Duration field and NAV. X, SIFS and Y are assumed with the same time unit. Otherwise, they should be converted before the Duration field is set.

Y may be obtained by dividing the length of the frame by the data rate corresponding to the MCS value in the SIG field of the frame and round up the time unit used for Duration setting.

The above method can be used for TXOP with multiple frame transmissions.

According to various embodiments, a SIG Field Design and associated Protocol or procedures (for example ACK (Acknowledgement) indication, ACK indication for Speed frame exchange, NDP (Null Data Packet) type indication) may be provided.

According to various embodiments, the following SIG field designs may be provided:

For 1 MHz, the following fields may be provided: MCS, Aggregation bit, Length, Ack Indication, NDP Indication, CRC, and Tail.

For >=2 MHz, the following fields may be provided: Length/Duration, MCS, BW, PAID, Ack Indication, NDP Indication, CRC, and Tail.

The fields may be defined as follows:
LENGTH/DURATION: in number of symbols when aggregation is 1, is in number of bytes when aggregation is 0, Mandate AMPDU for packet sizes >511 bytes and for MU;
MCS: for SU (single user), 4 bit MCS index; for MU (multi user), reuse 3 bits for BCC/LDPC indicator for users 2-4;
Aggregation: Mainly applicable for SU, reserved for MU;
Ack Indication: 2 bits-00: No Response; 01: NDP Response; 10: Normal Response; 11: Long Response. This field may indicate the presence and type of frame a SIFS time after the current frame transmission. Set to 0 for ACK; Set to 1 for Block ACK; Set to 2 for No ACK; Set to 3 for a frame not ACK, BA or CTS;
NDP Indication: Used to indicate that frame is a Control NDP frame. If set to 1, then the SIG field contents follow the description in 8.3.4a (NDP MAC frames).

FIG. 18 shows an illustration 1800 of a SIG-2 structure.

According to various embodiments, TXOP truncation/termination, flow control, NAV setting and RID update, speed frame exchange, and/or TXOP sharing for two-hop relaying may be provided, for example using a SIG field design.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:
1. A communication method comprising:
at least one of a communication device sending a first data unit comprising a physical layer (PHY) header or a communication device receiving a first data unit comprising a PHY header;
wherein the PHY header comprises one or more fields to indicate whether a response data unit is intended to follow the first data unit, and to indicate the type of the response data unit, when a response data unit is intended to follow the first data unit;
wherein the type of the response data unit can be used to estimate the duration of the response data unit;
wherein
the one or more fields comprise at least three bits,
a first value of the one or more fields indicates that no response data unit is intended to follow the first data unit,
a second value of the one or more fields indicates the intended response data unit is a null data packet type,
a third value of the one or more fields indicates the intended response data unit having the size equal to or smaller than that of normal ACK,
a fourth value of the one or more fields indicates the intended response data unit having the size equal to or smaller than that of normal Block Acknowledgement but larger than that of normal ACK, and
a fifth value of the one or more fields indicates the intended response data unit having the size larger than the size indicated by the fourth value listed above,
or wherein
the one or more fields comprise two bits,
a first value of the one or more fields indicates that no response data unit is intended to follow the first data unit,
a second value of the one or more fields indicates the intended response data unit is a null data packet type,
a third value of the one or more fields indicates the intended response data unit having the size equal to or shorter than a pre-determined value but larger than the size indicated in the second value, and
a fourth value of the one or more fields indicates the intended response data unit having the size larger than the size indicated by the third value.

2. The communication method of claim 1,
wherein the first data unit is a null data packet type PS-Poll and at least one of the fields in the PHY header indicates that the following response data unit is a null data packet type ACK and the null data packet type ACK is different from other null data packet type ACK and used only for the null data packet type PS-Poll.

3. The communication method of claim 1,
wherein at least a field indicates whether the response data unit is at least one of a normal response data type or a null data packet type.

4. The communication method of claim 3,
wherein the normal response data unit is at least one of normal ACK, normal Block ACK or a polling response frame.

5. The communication method of claim 3,
wherein the field comprises at least 2 bits and only one value of the field is used to indicate all the short data response units including at least one of the following: a null data packet format of ACK, a null data packet format of short response frame to null data type PS-Poll, a null data packet format of CTS, and a null data packet format of Block Ack frame.

6. The communication method of claim 1,
wherein the PHY header comprises an indication of a response data unit for at least one of speed frame exchange or TXOP sharing.

7. The communication method of claim 6,
wherein the type of the response data unit is a normal response data type for at least one of speed frame exchange or TXOP sharing.

8. The communication method of claim 7,
wherein the response data unit is a normal ACK and its Duration field for NAV setting protects the following transmission in one TXOP.

9. The communication method of claim 6,
wherein the type of the response data unit is a null data packet type for at least one of speed frame exchange or TXOP sharing.

10. The communication method of claim 9,
wherein the first data unit itself is a null data packet type PS-Poll and the response data unit is a null data packet response frame to null data type PS-Poll.

11. The communication method of claim 1,
wherein the first data unit is at least one of a null data packet type ACK or a null data packet type response frame responding to a null data type PS-Poll, and two or more bits in at least two fields of the first data unit indicate that there is no response data unit intended to follow the first data unit.

12. The communication method of claim 11,
wherein the Duration Indication field set to 0 and the Duration field set to 0 indicates that there is no response data unit intended to follow the first data unit.

13. The communication method of claim 1,
wherein the first data unit is a null data packet type ACK or a null data packet type response frame responding to a null data type PS-Poll, and two or more bits in at least two fields of the first data unit indicate that the response data unit is a type with the size larger than that of a normal data unit.

14. The communication method of claim 13,
wherein the Duration Indication field set to 1 and the Duration field set to 0 indicate that the response data unit is a type with the size larger than that of a normal data unit.

15. The communication method of claim 1,
wherein the intended receiver defers at least one of its transmission or channel access for at least a duration based on the indication for the type of the response data unit.

16. The communication method of claim 15,
wherein the type of the response data unit is a null data packet frame.

17. The communication method of claim 15,
wherein the type of the response data unit is a normal frame with the size equal to or short than that of a normal ACK.

18. The communication method of claim 15,
wherein the type of the response data unit is a normal frame with the size equal to or smaller than that of a normal Block ACK but larger than that of a normal ACK.

* * * * *